(12) United States Patent
Kim et al.

(10) Patent No.: US 11,101,257 B2
(45) Date of Patent: Aug. 24, 2021

(54) DISPLAY DEVICE AND METHOD OF MANUFACTURING THE SAME

(71) Applicant: Samsung Display Co., Ltd., Yongin-Si (KR)

(72) Inventors: Sikwang Kim, Daegu (KR); Minsuk Ko, Cheonan-si (KR); Taegyun Kim, Hwaseong-si (KR); Yong-hoon Yang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 16/544,044

(22) Filed: Aug. 19, 2019

(65) Prior Publication Data

US 2020/0066699 A1 Feb. 27, 2020

(30) Foreign Application Priority Data

Aug. 21, 2018 (KR) .................. 10-2018-0097411

(51) Int. Cl.
*H01L 25/075* (2006.01)
*H01L 25/16* (2006.01)
(Continued)

(52) U.S. Cl.
CPC ........ *H01L 25/167* (2013.01); *H01L 27/1248* (2013.01); *H01L 27/1259* (2013.01);
(Continued)

(58) Field of Classification Search
CPC combination set(s) only.
See application file for complete search history.

(56) References Cited

U.S. PATENT DOCUMENTS 9,329,433 B2 * 5/2016 Negishi ............. G02F 1/133603
2013/0015436 A1 * 1/2013 Yamazaki ............... H01L 29/45
257/43
(Continued)

FOREIGN PATENT DOCUMENTS

KR 101552670 B1 9/2015
KR 101713818 B1 3/2017
(Continued)

*Primary Examiner* — Ratisha Mehta
*Assistant Examiner* — Md M Islam
(74) *Attorney, Agent, or Firm* — Kile Park Reed & Houtteman PLLC

(57) ABSTRACT

A display device includes a pixel circuit, an insulating layer covering the pixel circuit, a first partition portion which is disposed on the insulating layer and extends in a first direction, a second partition portion which is spaced apart from the first partition portion in a second direction intersecting the first direction and extends in the first direction, a plurality of connection partition portions disposed between the first and second partition portions, where each of the plurality of connection partition portions extends in the second direction, a first electrode disposed on the first partition portion and electrically connected to the pixel circuit, a second electrode disposed on the second partition portion, and a light emitting element disposed between the plurality of connection partition portions and electrically connected to the first electrode and the second electrode.

21 Claims, 20 Drawing Sheets

(51) Int. Cl.
   *H01L 33/62* (2010.01)
   *H01L 27/12* (2006.01)
   *H01L 33/36* (2010.01)
   *H01L 33/32* (2010.01)
   *H01L 33/06* (2010.01)

(52) U.S. Cl.
   CPC ............ *H01L 33/62* (2013.01); *H01L 27/124* (2013.01); *H01L 33/06* (2013.01); *H01L 33/32* (2013.01); *H01L 33/36* (2013.01); *H01L 2933/0066* (2013.01)

(56) References Cited

U.S. PATENT DOCUMENTS

| | | |
|---|---|---|
| 2018/0019426 A1 | 1/2018 | Im et al. |
| 2018/0188606 A1* | 7/2018 | Lee .................. G02F 1/133609 |
| 2018/0287010 A1 | 10/2018 | Sung |
| 2019/0025696 A1 | 1/2019 | Chae et al. |

FOREIGN PATENT DOCUMENTS

| | | |
|---|---|---|
| KR | 1020180009015 A | 1/2018 |
| KR | 101817798 B1 | 2/2018 |
| KR | 101828214 B1 | 2/2018 |

\* cited by examiner

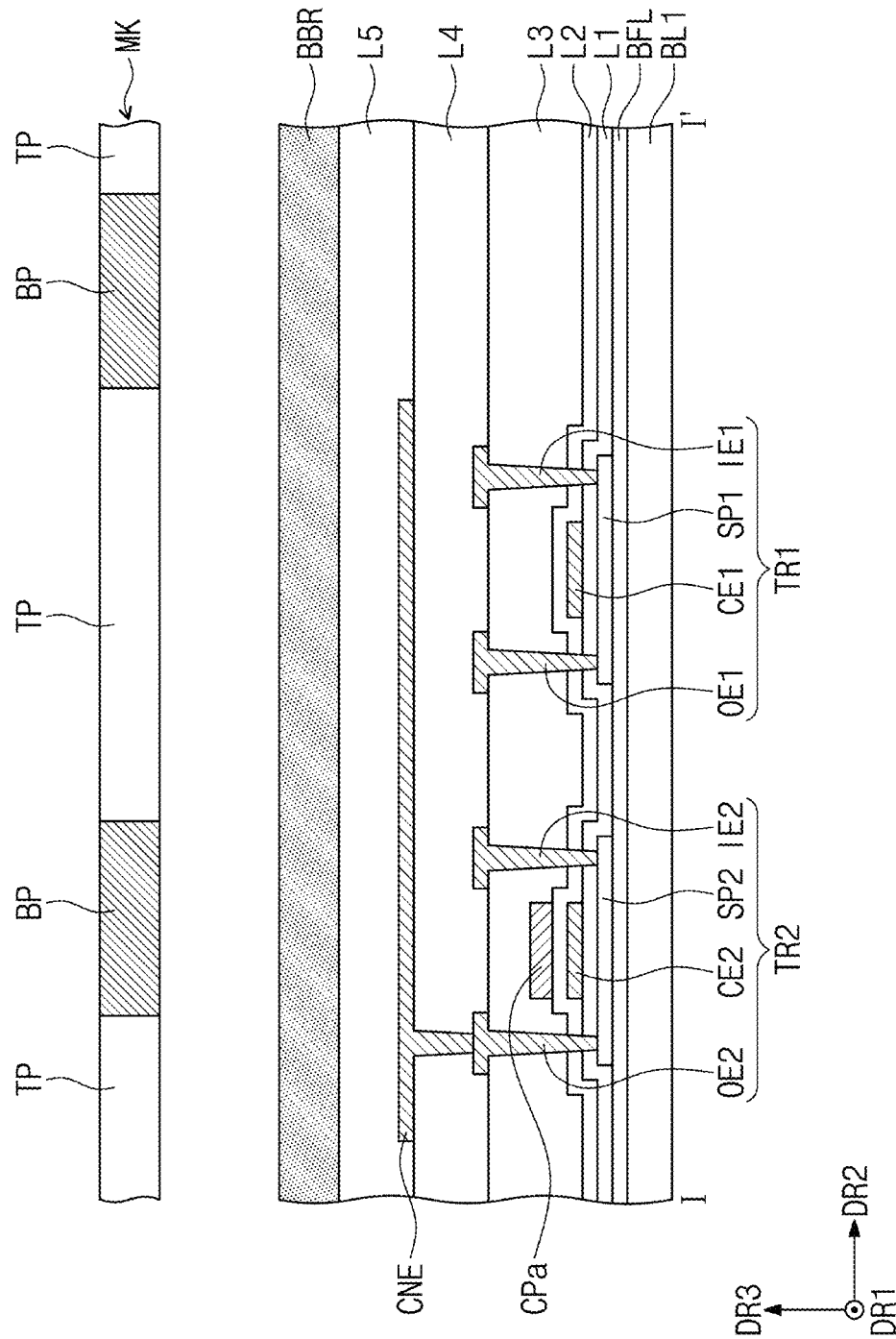

DISPLAY DEVICE AND METHOD OF MANUFACTURING THE SAME

This application claims priority to Korean Patent Application No. 10-2018-0097411, filed on Aug. 21, 2018, and all the benefits accruing therefrom under 35 U.S.C. § 119, the content of which in its entirety is herein incorporated by reference.

BACKGROUND

1. Field

The disclosure herein relates to a display device capable of improving reliability and a manufacturing yield and a method of manufacturing the same.

2. Description of the Related Art

A display device may include a light emitting element. The light emitting element may be electrically connected to an electrode and may emit light by a voltage applied to the electrode. The light emitting element may be formed directly on the electrode, or the light emitting element which is formed separately from the electrode may be connected to the electrode.

SUMMARY

In a display device, when a light emitting element is separately formed and then is connected to the electrode, it may be desired to align the light emitting element with the electrode. If the light emitting element is not regularly aligned with the electrode, the light emitting element may not emit light.

The disclosure may provide a display device with improved reliability and manufacturing yield, and a method of manufacturing the display device.

In an embodiment of the invention, a display device may include a pixel circuit, an insulating layer covering the pixel circuit, a first partition portion which is disposed on the insulating layer and extends in a first direction, a second partition portion which is spaced apart from the first partition portion in a second direction intersecting the first direction and extends in the first direction, a plurality of connection partition portions which is disposed between the first and second partition portions, where each of the plurality of connection partition portions extends in the second direction, a first electrode disposed on the first partition portion and electrically connected to the pixel circuit, a second electrode disposed on the second partition portion, and a light emitting element disposed between the plurality of connection partition portions and electrically connected to the first electrode and the second electrode.

In an embodiment, the light emitting element may be surrounded by the first partition portion, the second partition portion, and the plurality of connection partition portions when viewed in a plan view.

In an embodiment, the first partition portion, the second partition portion, and the plurality of connection partition portions may include the same material as each other.

In an embodiment, the first electrode may extend in the first direction and may cover the first partition portion, and the second electrode may extend in the first direction and may cover the second partition portion. In such an embodiment, a first distance in the second direction between the first and second electrodes in an area adjacent to the plurality of connection partition portions may be equal to a second distance in the second direction between the first and second electrodes in an area overlapping with the plurality of connection partition portions when viewed in the plan view.

In an embodiment, the first electrode may include a first extension electrode portion extending in the first direction, and a first protrusion electrode portion protruding from the first extension electrode portion in a direction toward the second electrode. In such an embodiment, the second electrode may include a second extension electrode portion extending in the first direction, and a second protrusion electrode portion protruding from the second extension electrode portion in a direction toward the first electrode.

In an embodiment, the first protrusion electrode portion may be disposed between the plurality of connection partition portions when viewed in the plan view, and the second protrusion electrode portion may be disposed between the plurality of connection partition portions when viewed in the plan view.

In an embodiment, a first distance in the second direction between the first protrusion electrode portion and the second protrusion electrode portion may be less than a second distance in the second direction between the first extension electrode portion and the second extension electrode portion when viewed in a plan view.

In an embodiment, each of the first and second partition portions may have a first thickness, each of the plurality of connection partition portions may have a second thickness, and the first thickness may be equal to the second thickness.

In an embodiment, each of the first and second partition portions may have a first thickness, each of the plurality of connection partition portions may have a second thickness, and the first thickness may be greater than the second thickness.

In an embodiment, each of the plurality of connection partition portions may have a trapezoidal shape when viewed in a cross-sectional view parallel to the first direction.

In an embodiment, an outermost surface of each of the plurality of connection partition portions may have a curvature when viewed in a cross-sectional view parallel to the first direction.

In an embodiment, the plurality of connection partition portions may be spaced apart from each other in the first direction. In such an embodiment, the first partition portion, the second partition portion and the plurality of connection partition portions may be connected to each other to constitute a single unitary body.

In an embodiment of the invention, a method of manufacturing a display device may include providing a pixel circuit on a base layer, providing an insulating layer covering the pixel circuit, providing a preliminary insulating layer on the insulating layer, patterning the preliminary insulating layer to form a first partition portion, a second partition portion, and a plurality of connection partition portions, providing a first electrode covering the first partition portion, providing a second electrode covering the second partition portion, providing a light emitting element between the first electrode and the second electrode and between the plurality of connection partition portions, and aligning the light emitting element.

In an embodiment, the patterning the preliminary insulating layer may include disposing a mask over the preliminary insulating layer, and exposing and developing the preliminary insulating layer using the mask to form the first partition portion, the second partition portion, and the plurality of connection partition portions.

In an embodiment, the mask may include a light blocking portion and a light transmitting portion. In such an embodiment, the disposing the mask over the preliminary insulating layer may include disposing the mask in a way such that the light blocking portion may be disposed to overlap with an area in which the first and second partition portions and the plurality of connection partition portions are to be formed, in the disposing of the mask.

In an embodiment, the mask may include a light blocking portion, a light transmitting portion, and a light semi-transmitting portion. In such an embodiment, the disposing the mask over the preliminary insulating layer may include disposing the mask in a way such that the light blocking portion may be disposed to overlap with an area in which the first and second partition portions are to be formed, and the light semi-transmitting portion may be disposed to overlap with an area in which the plurality of connection partition portions are to be formed, in the disposing of the mask.

In an embodiment of the invention, a display device may include a first partition portion extending in a first direction, a second partition portion which is spaced apart from the first partition portion in a second direction intersecting the first direction and extends in the first direction, a first electrode disposed on the first partition portion, a second electrode disposed on the second partition portion, a first connection partition portion disposed between the first partition portion and the second partition portion, a second connection partition portion disposed between the first partition portion and the second partition portion and spaced apart from the first connection partition portion in the first direction, and a light emitting element disposed in a space defined by the first and second partition portions and the first and second connection partition portions and electrically connected to the first and second electrodes.

In an embodiment, the first and second electrodes may extend in the first direction and may be spaced apart from each other in the second direction. In such an embodiment, a separation distance between the first and second electrodes in the second direction may be different depending on a position.

In an embodiment, the separation distance in an area overlapping with the first connection partition portion or the second connection partition portion may be greater than the separation distance in an area between the first connection partition portion and the second connection partition portion when viewed in a plan view.

In an embodiment, the first electrode may include a first extension electrode portion extending in the first direction, and a first protrusion electrode portion protruding from the first extension electrode portion in a direction toward the second electrode. In such an embodiment, the second electrode may include a second extension electrode portion extending in the first direction, and a second protrusion electrode portion protruding from the second extension electrode portion in a direction toward the first electrode. In such an embodiment, the first protrusion electrode portion and the second protrusion electrode portion may be disposed in an area between the first connection partition portion and the second connection partition portion.

BRIEF DESCRIPTION OF THE DRAWINGS

These and/or other features of the invention will become apparent and more readily appreciated from the following description of the exemplary embodiments, taken in conjunction with the accompanying drawings, in which:

FIGS. 12A, 12B, 12C and 12D are schematic views illustrating an embodiment of a process of forming a first partition portion, a second partition portion, and a plurality of connection partition portions;

DETAILED DESCRIPTION

Figure 1:
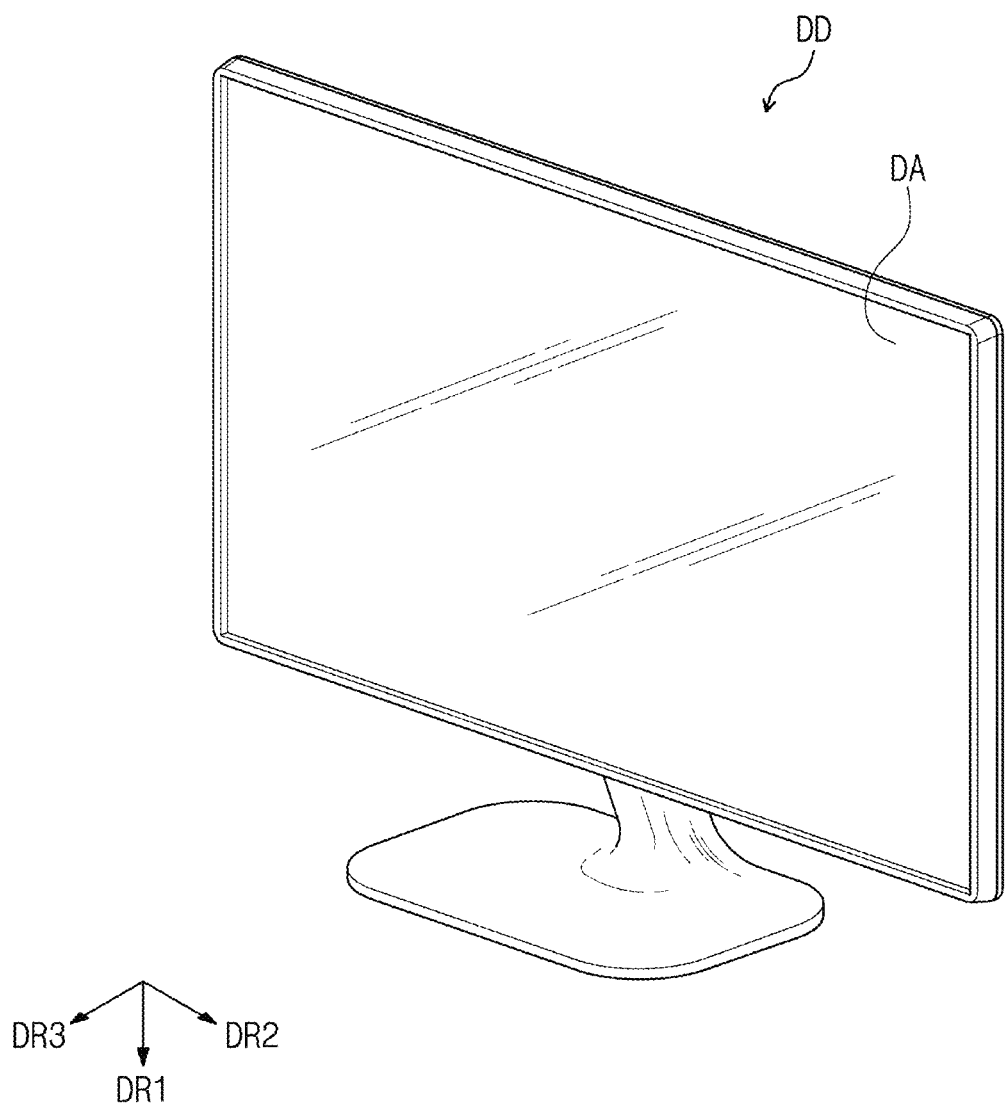
FIG. 1 is a perspective view illustrating a display device according to an embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements.

The terminology used herein is for the purpose of describing particular embodiments only and is not intended to be limiting. As used herein, the singular forms "a," "an," and "the" are intended to include the plural forms, including "at least one," unless the context clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

Hereinafter, exemplary embodiments of the invention will be described in detail with reference to the accompanying drawings.

FIG. 1 is a perspective view illustrating a display device according to an embodiment of the invention.

Referring to FIG. 1, an embodiment of a display device DD may display an image through a display area DA defined therein. In an embodiment, as shown in FIG. 1, the display area DA is provided in a plane defined by a first direction DR1 and a second direction DR2 intersecting the first direction DR1. However, embodiments of the invention are not limited thereto. In an alternative embodiment, the display area of the display device DD may be provided in a curved plane.

A thickness direction of the display device DD may be indicated by a third direction DR3. Directions indicated by the first to third directions DR1, DR2 and DR3 may be relative concepts and may be changed into other directions. The clause "when viewed in a plan view" used herein may mean a clause "when viewed from a plan view in the third direction DR3". In addition, the term "thickness direction" may mean the third direction DR3.

In FIG. 1, an embodiment, where the display device DD is a television is illustrated. In other embodiments, the display device DD may be large-sized electronic devices (e.g., monitors and external billboards) or small and middle-sized electronic devices (e.g., personal computers, notebook computers, personal digital assistants ("PDA" s), car navigation units, game consoles, smart phones, tablets and cameras). However, these are merely exemplary, and the display device may also be applied to other electronic devices without departing the spirits and scopes of the invention.

Figure 2:
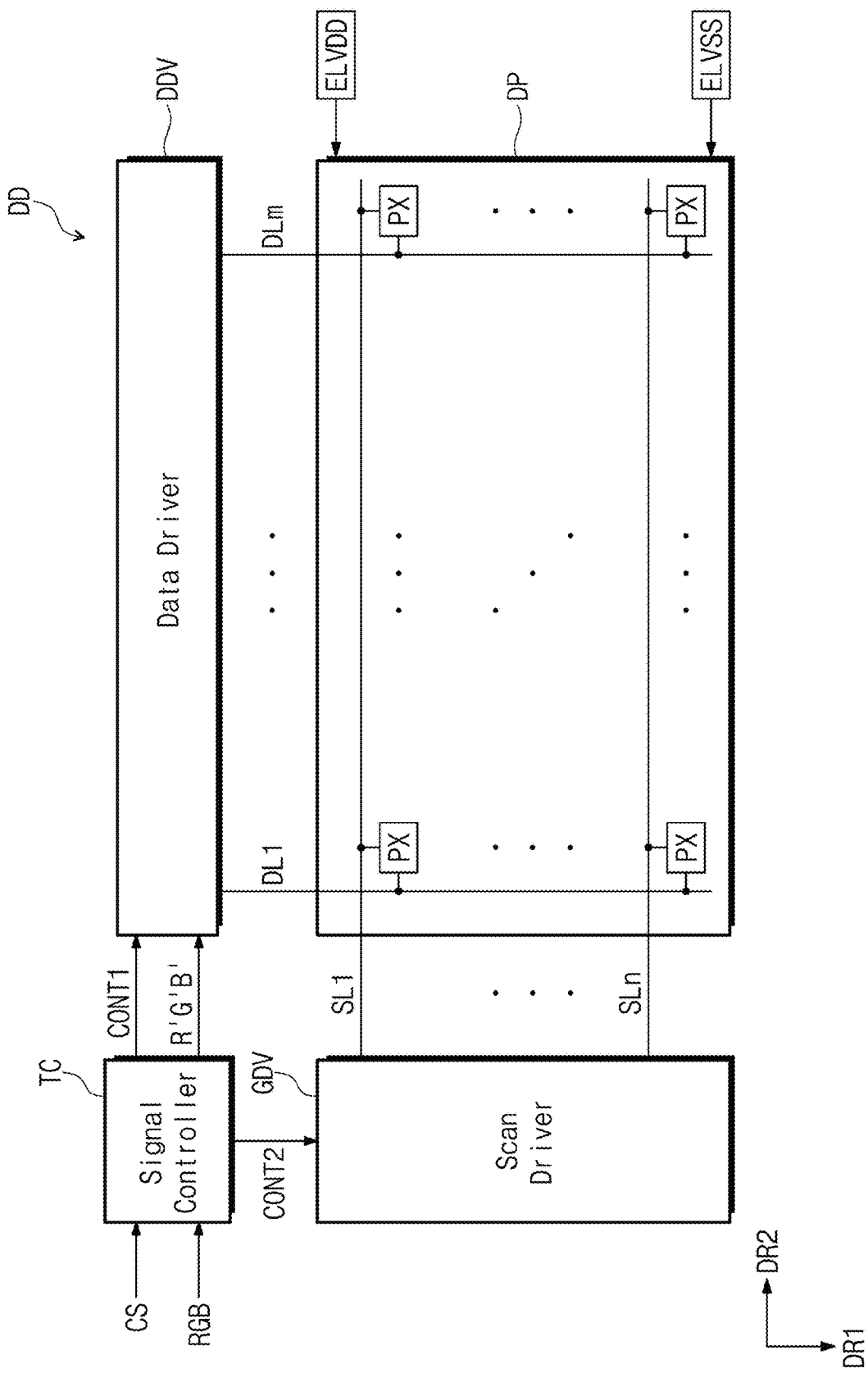
FIG. 2 is a block diagram illustrating a display device according to an embodiment of the invention.

FIG. 2 is a block diagram illustrating a display device according to an embodiment of the invention.

Referring to FIG. 2, an embodiment of the display device DD may include a display panel DP, a signal controller (or a timing controller) TC, a data driver DDV, and a scan driver GDV. Each of the signal controller TC, the data driver DDV, and the scan driver GDV may include a circuit.

The display panel DP may be a micro-sized light emitting element display panel including a micro-sized light emitting element. In one embodiment, for example, the display panel DP may be a micro light emitting diode (micro LED) display panel.

The display panel DP may include a plurality of data lines DL1 to DLm, a plurality of scan lines SL1 to SLn, and a plurality of pixels PX.

The plurality of data lines DL1 to DLm may extend in a first direction DR1 and may be arranged in a second direction DR2 intersecting the first direction DR1. The plurality of scan lines SL1 to SLn may extend in the second direction DR2 and may be arranged in the first direction DR1.

Each of the pixels PX may include a light emitting element and a pixel circuit electrically connected to the light emitting element. The pixel circuit may include a plurality of transistors. A first power source voltage ELVDD and a second power source voltage ELVSS may be provided to each of the pixels PX.

The pixels PX may be regularly arranged on the display panel DP when view in a plane view. Each of the pixels PX may display one of primary colors or one of mixed colors.

The primary colors may include a red color, a green color, and a blue color, and the mixed colors may include various colors such as a yellow color, a cyan color, a magenta color, and a white color. However, the colors displayed by the pixels PX are not limited thereto.

In an embodiment, the signal controller TC may receive image data RGB from an external system. The signal controller TC may convert the image data RGB into converted image data R'G'B' appropriate to operations of the display panel DP and may output or provide the converted image data R'G'B' to the data driver DDV.

In such an embodiment, the signal controller TC may receive a control signal CS from the external system. The control signal CS may include a vertical sync signal, a horizontal sync signal, a main clock signal, and a data enable signal. The signal controller TC may provide a first control signal CONT1 to the data driver DDV and may provide a second control signal CONT2 to the scan driver GDV. The first control signal CONT1 may be a signal for controlling the data driver DDV, and the second control signal CONT2 may be a signal for controlling the scan driver GDV.

The data driver DDV may provide electrical signals or voltages to the plurality of data lines DL1 to DLm in response to the first control signal CONT1 received from the signal controller TC. The data driver DDV may be realized as an independent integrated circuit to be electrically connected to a side of the display panel DP or to be mounted directly on the display panel DP. In some embodiments, the data driver DDV may be realized as a single chip or may include a plurality of chips.

The scan driver GDV may provide electrical signals to the scan lines SL1 to SLn in response to the second control signal CONT2 received from the signal controller TC. The scan driver GDV may be integrated in a predetermined area of the display panel DP. In one embodiment, for example, the scan driver GDV may include a plurality of thin film transistors formed by a same process (e.g., a low-temperature polycrystalline silicon ("LTPS") process or a low-temperature polycrystalline oxide ("LTPO") process) as the pixel circuits of the pixels PX. Alternatively, the scan driver GDV may be realized as an independent integrated circuit chip to be electrically connected to a side of the display panel DP.

While a gate on voltage is applied to one of scan line of the plurality of scan lines SL1 to SLn, switching transistors of pixels of one row connected to the one scan line may be turned on. When the data driver DDV provides data driving signals to the data lines DL1 to DLm, the data driving signals supplied to the data lines DL1 to DLm may be applied to the pixels through the turned-on switching transistors. The data driving signals may be analog voltages corresponding to gray scale values of the image data.

Figure 3:
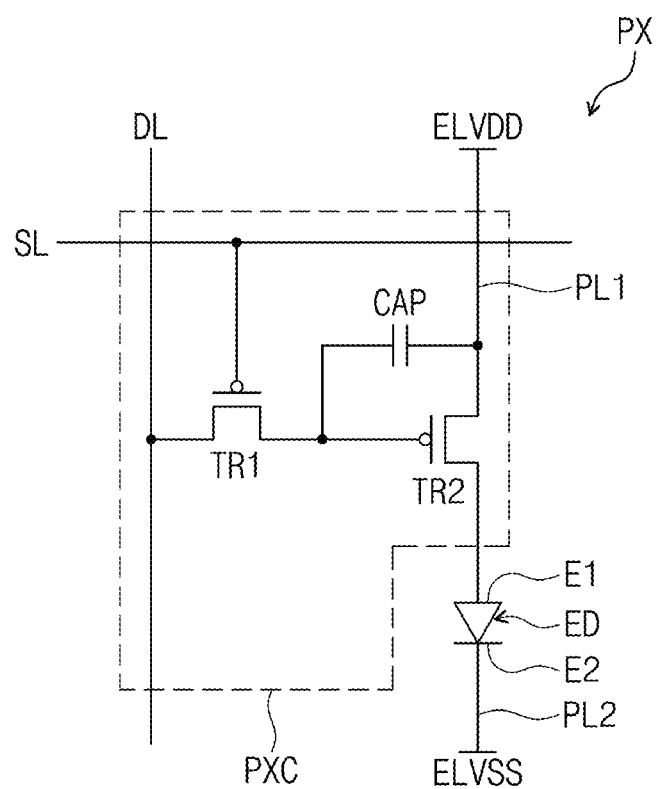
FIG. 3 is an equivalent circuit diagram of a pixel according to an embodiment of the invention.

FIG. 3 is an equivalent circuit diagram of a pixel according to an embodiment of the invention. FIG. 3 illustrates an equivalent circuit diagram of one of the plurality of pixels PX of FIG. 2.

Referring to FIG. 3, an embodiment of a pixel PX may be electrically connected to a plurality of signal lines. In an embodiment, a scan line SL, a data line DL, a first power source line PL1, and a second power source line PL2 collectively define the signal lines. However, embodiments of the invention are not limited thereto. In an alternative embodiment, the pixel PX may be additionally connected to at least one of other various signal lines.

The pixel PX may include a light emitting element ED, a first electrode E1, a second electrode E2, and a pixel circuit PXC. The pixel circuit PXC may include a first thin film transistor TR1, a capacitor CAP, and a second thin film transistor TR2. However, the numbers of the thin film transistor(s) and the capacitor(s) included in the pixel circuit PXC are not limited to those in FIG. 3. In an alternative embodiment, the pixel circuit PXC may include seven thin film transistors and one capacitor.

The first thin film transistor TR1 may be a switching transistor configured to control on/off of the pixel PX. The first thin film transistor TR1 may transmit or block a data signal provided through the data line DL in response to a scan signal provided through the scan line SL.

The capacitor CAP may be connected to the first thin film transistor TR1 and the first power source line PL1. The capacitor CAP may be charged with charges or voltages corresponding to a difference between the data signal transmitted from the first thin film transistor TR1 and the first power source voltage ELVDD provided through the first power source line PL1.

The second thin film transistor TR2 may be connected to the first thin film transistor TR1, the capacitor CAP, and the light emitting element ED. The second thin film transistor TR2 may control a driving current, flowing through the light emitting element ED, in response to the amount of the charges stored in the capacitor CAP. A turn-on time of the second thin film transistor TR2 may be determined depending on the amount of the charges stored in the capacitor CAP.

In an embodiment, all of the first and second thin film transistors TR1 and TR2 may be N-type thin film transistors or P-type thin film transistors, but not being limited thereto. Alternatively, one of the first and second thin film transistors TR1 and TR2 may be an N-type thin film transistor, and the other of the first and second thin film transistors TR1 and TR2 may be a P-type thin film transistor.

The light emitting element ED may be connected to the second thin film transistor TR2 and the second power source line PL2. In one embodiment, for example, the light emitting element ED may be connected to the first electrode E1 electrically connected to the second thin film transistor TR2 and the second electrode E2 electrically connected to the second power source line PL2. The first electrode E1 may be electrically connected to the pixel circuit PXC, and the second electrode E2 may receive a power source voltage (e.g., the second power source voltage ELVSS) through the second power source line PL2.

The light emitting element ED may emit light by a voltage corresponding to a difference between a signal transmitted through the second thin film transistor TR2 and the second power source voltage ELVSS received through the second power source line PL2.

The light emitting element ED may be a micro-sized LED element. The micro-sized LED element may be a LED element having a length of several nanometers to hundreds micrometers. However, the length of the micro-sized LED element is not limited to the numeral range.

In an embodiment, as shown in FIG. 3, one light emitting element ED may be connected between the second thin film transistor TR2 and the second power source line PL2, but not being limited thereto. In an alternative embodiment, the light emitting element ED may be provided in plurality. The plurality of light emitting elements ED may be connected in parallel to each other.

Figure 4A:
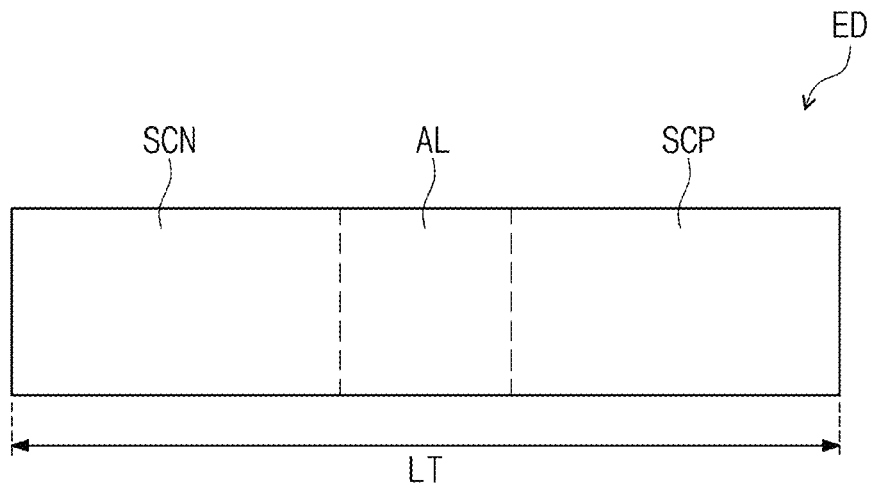
FIG. 4A is a cross-sectional view illustrating a light emitting element according to an embodiment of the invention.

FIG. 4A is a cross-sectional view illustrating a light emitting element according to an embodiment of the invention.

The light emitting element ED may have one of various shapes such as a circular cylindrical shape and a polygonal pillar shape. FIG. 4A illustrates a cross section of the light emitting element ED.

Referring to FIG. 4A, an embodiment of the light emitting element ED may include an N-type semiconductor layer SCN, a P-type semiconductor layer SCP, and an active layer AL. The active layer AL may be disposed between the N-type semiconductor layer SCN and the P-type semiconductor layer SCP.

The N-type semiconductor layer SCN may be provided by doping a semiconductor layer with N-type dopants, and the P-type semiconductor layer SCP may be provided by doping the semiconductor layer with P-type dopants. The semiconductor layer may include a semiconductor material. In one embodiment, for example, the semiconductor material may include, but not limited to, GaN, AN, AlGaN, InGaN, InN, InAlGaN, or AlInN. In one embodiment, for example, the N-type dopants may include, but not limited to, silicon (Si), germanium (Ge), tin (Sn), selenium (Se), tellurium (Te), or any combination thereof. In one embodiment, for example, the P-type dopants may include, but not limited to, magnesium (Mg), zinc (Zn), calcium (Ca), strontium (Sr), barium (Ba), or any combination thereof.

The active layer AL may have at least one of a single quantum well structure, a multiple quantum well structure, a quantum wire structure and a quantum dot structure. In the active layer AL, electrons injected through the N-type semiconductor layer SCN may be recombined with holes injected through the P-type semiconductor layer SCP. The active layer AL may be a layer configured to emit light having energy determined by an intrinsic energy band of a material. The position of the active layer AL may be variously changed depending on a kind of a diode.

The N-type semiconductor layer SCN may be connected to one of the first and second electrodes E1 and E2 (see FIG. 3), and the P-type semiconductor layer SCP may be connected to the other of the first and second electrodes E1 and E2.

A length LT of the light emitting element ED may be in a range from several nanometers to hundreds micrometers. In one embodiment, for example, the length LT of the light emitting element ED may be in a range from 1 micrometer to 100 micrometers.

Figure 4B:
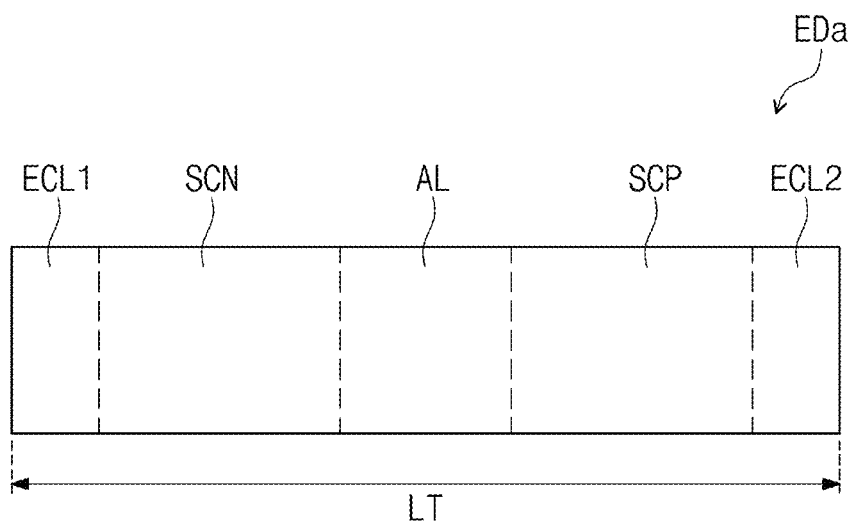
FIG. 4B is a cross-sectional view illustrating a light emitting element according to an alternative embodiment of the invention.

FIG. 4B is a cross-sectional view illustrating a light emitting element according to an alternative embodiment of the invention.

Referring to FIG. 4B, such an embodiment of a light emitting element EDa may be substantially the same as the embodiment of the light emitting element ED shown in FIG. 4A except that the light emitting element EDa further includes a first electrode layer ECL1 and a second electrode layer ECL2. The same or like elements shown in FIG. 4B have been labeled with the same reference characters as used above to describe the embodiments of the light emitting element ED shown in FIG. 4A, and any repetitive detailed description thereof will hereinafter be omitted or simplified.

The first electrode layer ECL1 may be adjacent to the N-type semiconductor layer SCN, and the second electrode layer ECL2 may be adjacent to the P-type semiconductor layer SCP. In one embodiment, for example, the first electrode layer ECL1, the N-type semiconductor layer SCN, the active layer AL, the P-type semiconductor layer SCP, and the second electrode layer ECL2 may be sequentially arranged or stacked one on another.

Each of the first and second electrode layers ECL1 and ECL2 may include or be formed of a metal or an alloy of metals. In one embodiment, for example, each of the first and second electrode layers ECL1 and ECL2 may include or be formed of molybdenum (Mo), chromium (Cr), nickel (Ni), gold (Au), aluminum (Al), titanium (Ti), platinum (Pt), vanadium (V), tungsten (W), lead (Pb), palladium (Pd), copper (Cu), rhodium (Rh), iridium (Ir), or any alloy thereof. The first electrode layer ECL1 and the second electrode layer ECL2 may include a same material as each other or different materials from each other.

Figure 4C:
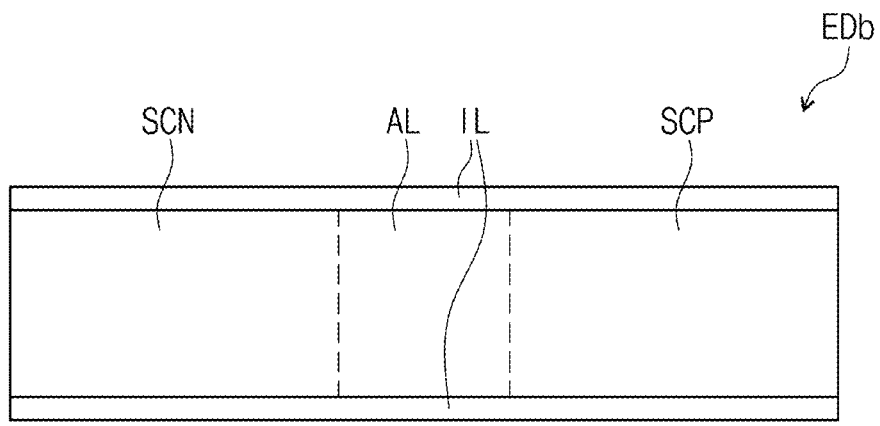
FIG. 4C is a cross-sectional view illustrating a light emitting element according to another alternative embodiment of the invention.

FIG. 4C is a cross-sectional view illustrating a light emitting element according to another alternative embodiment of the invention.

Referring to FIG. 4C, such an embodiment of a light emitting element EDb may be substantially the same as the embodiment of the light emitting element ED shown in FIG. 4A except that the light emitting element EDb further includes an insulating layer IL. In one embodiment, for example, the light emitting element EDb may have a core-shell structure. The same or like elements shown in FIG. 4C have been labeled with the same reference characters as used above to describe the embodiments of the light emitting element ED shown in FIG. 4A, and any repetitive detailed description thereof will hereinafter be omitted or simplified.

The insulating layer IL may cover the N-type semiconductor layer SCN, the P-type semiconductor layer SCP, and the active layer AL and may protect outer surfaces of the N-type semiconductor layer SCN, the P-type semiconductor layer SCP and the active layer AL. In an alternative embodiment, the insulating layer IL may cover only the active layer AL.

Figure 4D:
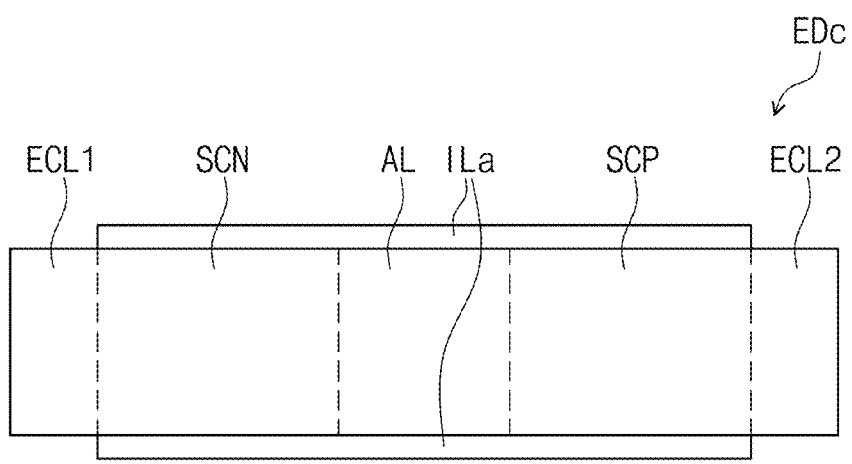
FIG. 4D is a cross-sectional view illustrating a light emitting element according to another alternative embodiment of the invention.

FIG. 4D is a cross-sectional view illustrating a light emitting element according to another alternative embodiment of the invention.

Referring to FIG. 4D, such an embodiment of a light emitting element EDc may be substantially the same as the embodiment of the light emitting element EDa shown in FIG. 4B except that the light emitting element EDc further includes an insulating layer ILa. The same or like elements shown in FIG. 4D have been labeled with the same reference characters as used above to describe the embodiments of the light emitting element EDa shown in FIG. 4B, and any repetitive detailed description thereof will hereinafter be omitted or simplified.

In such an embodiment, the insulating layer ILa may cover the N-type semiconductor layer SCN, the P-type semiconductor layer SCP, and the active layer AL but may not cover the first electrode layer ECL1 and the second electrode layer ECL2. In an alternative embodiments, the insulating layer ILa may cover at least a portion of the first and second electrode layers ECL1 and ECL2 or may fully cover the first and second electrode layers ECL1 and ECL2.

Figure 5:
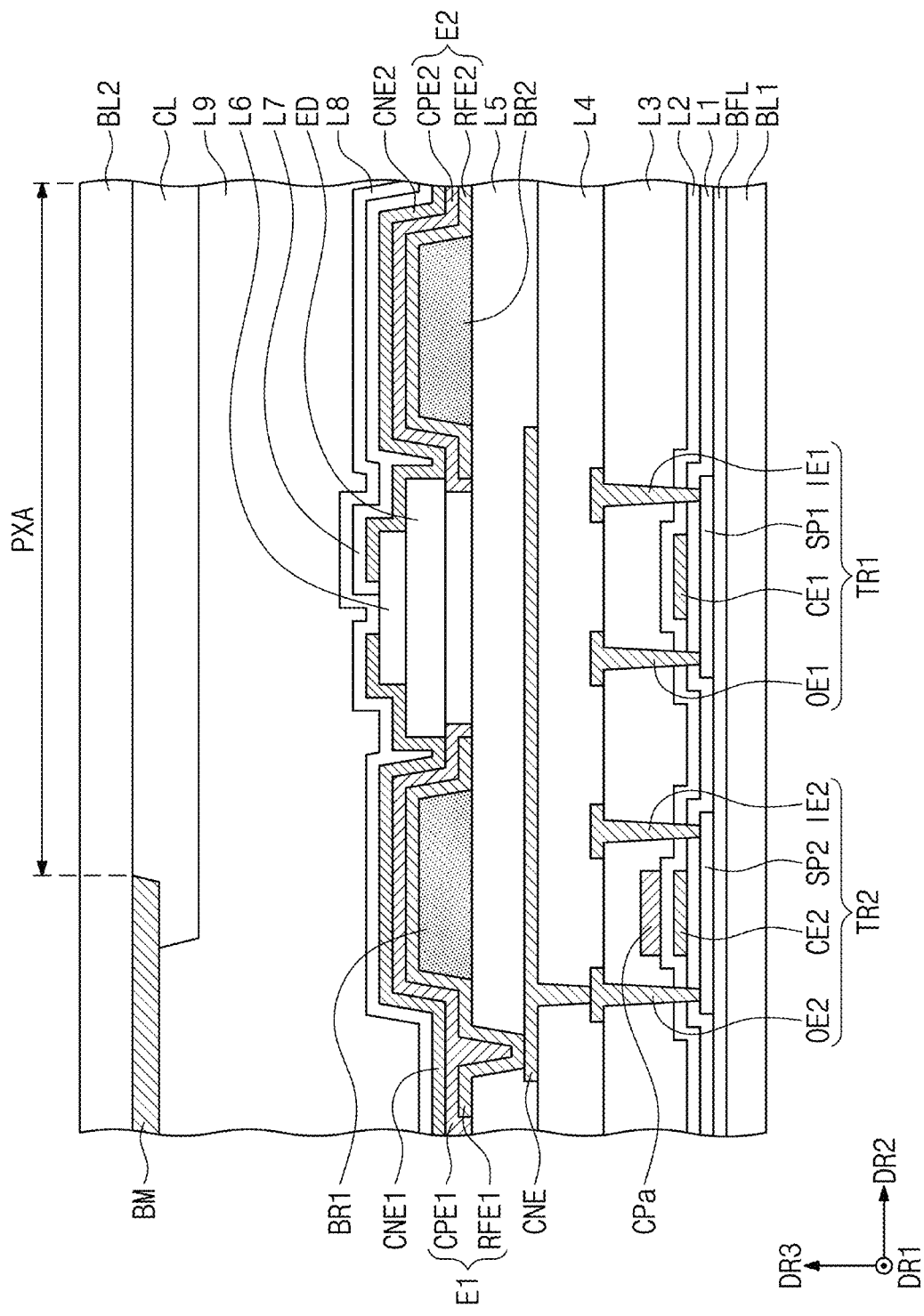
FIG. 5 is a cross-sectional view illustrating a display panel according to an embodiment of the invention.
Figure 6:
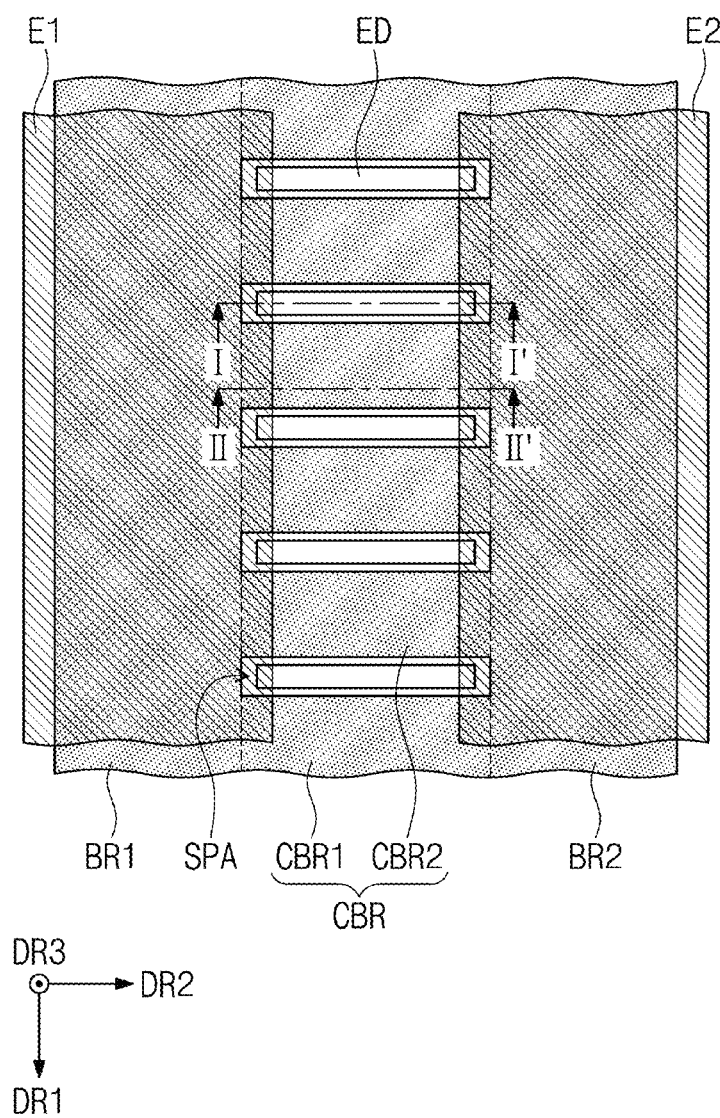
FIG. 6 is a plan view illustrating some components of a display panel according to an embodiment of the invention.

FIG. 5 is a cross-sectional view illustrating a display panel according to an embodiment of the invention, and FIG. 6 is a plan view illustrating some components of a display panel according to an embodiment of the invention. For the purpose of ease and convenience in description and illustration, FIGS. 5 and 6 illustrate an area corresponding to one pixel and some components are omitted in FIGS. 5 and 6.

Referring to FIGS. 5 and 6, in an embodiment of the display panel, a first base layer BL1 and a second base layer BL2 may be disposed to opposite to or face each other. Each of the first and second base layers BL1 and BL2 may be a silicon substrate, a plastic substrate, a glass substrate or an insulating film, or may have a stack structure including a plurality of insulating layers.

A buffer layer BFL may be disposed on the first base layer BL1. A first thin film transistor TR1 and a second thin film transistor TR2 may be disposed on the buffer layer BFL.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first semiconductor pattern SP1 and the second semiconductor pattern SP2 may be disposed on the buffer layer BFL. In an embodiment, the buffer layer BFL may provide a reformed or modified surface to the first semiconductor pattern SP1 and the second semiconductor pattern SP2. In such an embodiment, adhesive strength between the buffer layer BFL and the first semiconductor pattern SP1 and the second semiconductor pattern SP2 may be improved as compared with a case where the first semiconductor pattern SP1 and the second semiconductor pattern SP2 are formed directly on the first base layer BL1. Alternatively, the buffer layer BFL may be a barrier layer for protecting bottom surfaces of the first semiconductor pattern SP1 and the second semiconductor pattern SP2. In such an embodiment, the buffer layer BFL may inhibit or prevent a contaminant or moisture from permeating to the first and second semiconductor patterns SP1 and SP2 from the inside of the first base layer BL1 or through the first base layer BL1.

A first insulating layer L1 may be disposed on the buffer layer BFL and may cover the first and second semiconductor patterns SP1 and SP2. The first insulating layer L1 may include an inorganic material. In one embodiment, for example, the inorganic material may include, but not limited to, silicon nitride, silicon oxynitride, silicon oxide, titanium oxide, or aluminum oxide.

The first control electrode CE1 and the second control electrode CE2 may be disposed on the first insulating layer L1. A second insulating layer L2 may be disposed on the first insulating layer L1 and may cover the first control electrode CE1 and the second control electrode CE2. The second insulating layer L2 may include an inorganic material.

The capacitor CAP (see FIG. 3) may include a first capacitor electrode (not shown) and a second capacitor electrode CPa. In one embodiment, for example, the first capacitor electrode may be defined by a portion branched from the second control electrode CE2, and the second capacitor electrode CPa may be disposed on the second insulating layer L2.

A third insulating layer L3 may be disposed on the second insulating layer L2 and may cover the second capacitor electrode CPa. The first input electrode IE1, the first output electrode OE1, the second input electrode IE2 and the second output electrode OE2 may be disposed on the third insulating layer L3. The first input electrode IE1 and the first output electrode OE1 may be connected to the first semiconductor pattern SP1 through through-holes defined through the first to third insulating layers L1, L2 and L3. The second input electrode IE2 and the second output electrode OE2 may be connected to the second semiconductor pattern SP2 through through-holes defined through the first to third insulating layers L1, L2 and L3. At least a portion of each of signal lines (e.g., scan lines or data lines) as well as the first input and output electrodes IE1 and OE1 and the second input and output electrodes IE2 and OE2 may be disposed on the third insulating layer L3.

A fourth insulating layer L4 may be disposed on the third insulating layer L3 and may cover the first input electrode IE1, the first output electrode OE1, the second input electrode IE2, and the second output electrode OE2. The fourth insulating layer L4 may have a single layer structure or a multi-layer structure including a plurality of layers. The fourth insulating layer L4 may include an organic material and/or an inorganic material.

A connection electrode CNE may be disposed on the fourth insulating layer L4. In addition to the connection electrode CNE, at least another portion of each of the signal lines (e.g., the scan lines or the data lines) may be disposed on the fourth insulating layer L4. The connection electrode CNE may be connected to the second output electrode OE2.

A fifth insulating layer L5 may be disposed on the fourth insulating layer L4 and may cover the connection electrode CNE. The fifth insulating layer L5 may include an organic material. The fifth insulating layer L5 may cover the pixel circuit PXC (see FIG. 3) disposed thereunder and may have a flat top surface.

A first partition portion BR1, a second partition portion BR2 and a plurality of connection partition portions CBR may be disposed on the fifth insulating layer L5. Each of the first and second partition portions BR1 and BR2 may extend in the first direction DR1. The second partition portion BR2 may be spaced apart from the first partition portion BR1 in the second direction DR2. The connection partition portions CBR may be disposed between the first partition portion BR1 and the second partition portion BR2. Each of the connection partition portions CBR may extend in the second direction DR2. The connection partition portions CBR may be spaced apart from each other in the first direction DR1 and may be arranged in the first direction DR1. The first partition portion BR1, the second partition portion BR2 and the connection partition portions CBR may include a same material as each other. In one embodiment, for example, each of the first partition portion BR1, the second partition portion BR2 and the connection partition portions CBR may include an organic material. The first partition portion BR1, the second partition portion BR2 and the plurality of connection partition portions CBR may be connected to each other to constitute a single unitary body.

A first electrode E1 may be disposed on the first partition portion BR1, and a second electrode E2 may be disposed on the second partition portion BR2. The first electrode E1 may extend in the first direction DR1 and may cover the first partition portion BR1. The second electrode E2 may extend in the first direction DR1 and may cover the second partition portion BR2. In such an embodiment, the first partition portion BR1 may be disposed between the first electrode E1 and the fifth insulating layer L5, and the second partition portion BR2 may be disposed between the second electrode E2 and the fifth insulating layer L5.

A through-hole may be defined in the fifth insulating layer L5, and a portion of the connection electrode CNE may be exposed by the through-hole. The first electrode E1 may be electrically connected to the exposed portion of the connection electrode CNE. Even though not shown in the drawings, the second electrode E2 may be electrically connected to the second power source line PL2 (see FIG. 3). In such an embodiment, the second power source voltage ELVSS (see FIG. 3) may be provided to the second electrode E2.

The first electrode E1 may include a first reflective electrode RFE1 and a first capping electrode CPE1, and the second electrode E2 may include a second reflective electrode RFE2 and a second capping electrode CPE2.

Each of the first and second reflective electrodes RFE1 and RFE2 may include a reflective material. Each of the first and second reflective electrodes RFE1 and RFE2 may have a single-layer structure or a multi-layer structure. In one embodiment, for example, each of the first and second reflective electrodes RFE1 and RFE2 may have a structure in which an indium tin oxide ("ITO") layer, a silver (Ag) layer, and an indium tin oxide ("ITO") layer are sequentially stacked one on another.

The first capping electrode CPE1 may cap or cover the first reflective electrode RFE1, and the second capping electrode CPE2 may cap or cover the second reflective electrode RFE2. In one embodiment, for example, each of the first and second capping electrodes CPE1 and CPE2 may include at least one of IZO, ITO, indium gallium oxide ("IGO"), indium zinc gallium oxide ("IGZO"), or any mixture/compound thereof.

The light emitting element ED may be disposed on the fifth insulating layer L5. The light emitting element ED may be provided in plural, and the plurality of light emitting elements ED may be connected in parallel to each other. Even though not shown in the drawings, an insulating pattern (not shown) may be disposed between the fifth insulating layer L5 and the light emitting element ED. The light emitting element ED may be electrically connected to the first electrode E1 and the second electrode E2. The light emitting element ED may be disposed between the plurality of connection partition portions CBR. In one embodiment, for example, the light emitting element ED may be surrounded by the first partition portion BR1, the second partition portion BR2, and the plurality of connection partition portions CBR when viewed in a plan view.

In an embodiment, as shown in FIG. 5, a portion of the light emitting element ED is disposed on the first electrode E1, and another portion of the light emitting element ED is disposed on the second electrode E2. However, embodiments of the invention are not limited thereto. In an alternative embodiment, the light emitting element ED may be disposed between the first electrode E1 and the second electrode E2. In one embodiment, for example, the length of the light emitting element ED may be less than a distance between the first electrode E1 and the second electrode E2. In an embodiment, the light emitting element ED may not overlap with the first electrode E1 and the second electrode E2 when viewed in a plan view.

A sixth insulating layer (or an insulating pattern) L6 may be disposed on the light emitting element ED. The sixth insulating layer L6 may cover at least a portion of a top surface of the light emitting element ED.

The light emitting element ED may be electrically connected to the first electrode E1 by a first connection electrode CNE1 and may be electrically connected to the second electrode E2 by a second connection electrode CNE2.

The second connection electrode CNE2 may be disposed on the light emitting element ED and the second electrode E2. A seventh insulating layer L7 may be disposed on the second connection electrode CNE2. The first connection electrode CNE1 may be disposed on the light emitting element ED and the first electrode E1. Even though the length of the light emitting element ED is hundreds micrometers or less, the second connection electrode CNE2 and the first connection electrode CNE1 may not be in direct contact with each other, due to the seventh insulating layer L7. However, embodiments of the invention are not limited thereto. In an alternative embodiment, the first and second connection electrodes CNE1 and CNE2 may be formed at the same time by a same process. In such an embodiment, the seventh insulating layer L7 may be omitted.

The first and second connection electrodes CNE1 and CNE2 may include a conductive material. In one embodiment, for example, the conductive material may include at least one of IZO, ITO, IGO, IGZO, or any mixture/compound thereof. However, embodiments of the invention are not limited thereto. In one alternative embodiment, for example, the conductive material may be a metal material which may include, for example, molybdenum, silver, titanium, copper, aluminum, or any alloy thereof.

An eighth insulating layer L8 may be disposed on the first connection electrode CNE1 and the seventh insulating layer L7. The eighth insulating layer L8 may be an encapsulation layer.

A light blocking layer BM may be disposed on one surface of the second base layer BL2, which faces the first base layer BL1. An opening may be defined in the light blocking layer BM, and a wavelength conversion part CL may be disposed to cover the opening. An area exposed by the opening may correspond to a pixel light emitting area PXA.

The wavelength conversion part CL may include an illuminant or a photoluminescent material. In one embodiment, for example, the illuminant may absorb first light provided from the light emitting element ED and may convert a wavelength of the first light into a wavelength of second light having a different color from that of the first light. In such an embodiment, the illuminant may convert the first light into the second light and may emit the second light. The illuminant may be, for example, a quantum dot. The first light may be a blue light, and the second light may be a green light or a red light. However, embodiments of the invention are not limited thereto. In an alternative embodiment, the wavelength conversion part CL may be replaced with a color filter. The color filter may absorb light of a specific wavelength to realize a specific color. In another alternative embodiment, the wavelength conversion part CL may be omitted. In such an embodiment, the light emitting element ED may emit a blue light, a green light, or a red light.

A ninth insulating layer L9 may be disposed between the wavelength conversion part CL and the eighth insulating layer L8. In one embodiment, for example, by the ninth insulating layer L9, the first base layer BL1 on which the pixel circuit PXC (see FIG. 3) and the light emitting element ED are disposed may be coupled to the second base layer BL2 on which the wavelength conversion part CL and the light blocking layer BM are disposed. In one embodiment, for example, the ninth insulating layer L9 may include an optically clear adhesive film, an optically clear resin, or a pressure sensitive adhesive film. However, embodiments of the invention are not limited thereto. In another embodiment, the ninth insulating layer L9 may be omitted.

Figure 7A:
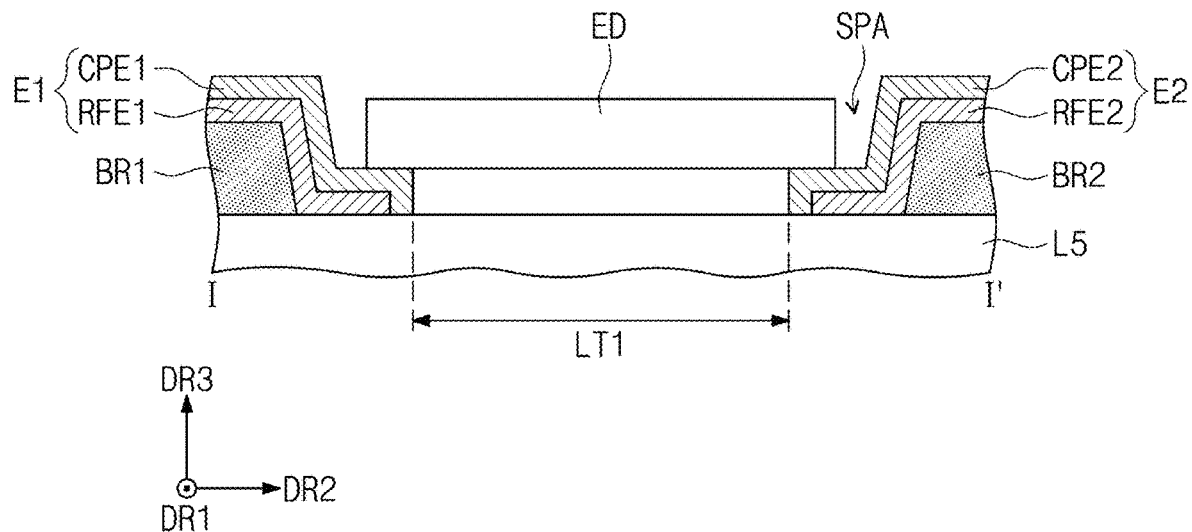
FIG. 7A is a cross-sectional view taken along line I-I' of FIG. 6.
Figure 7B:
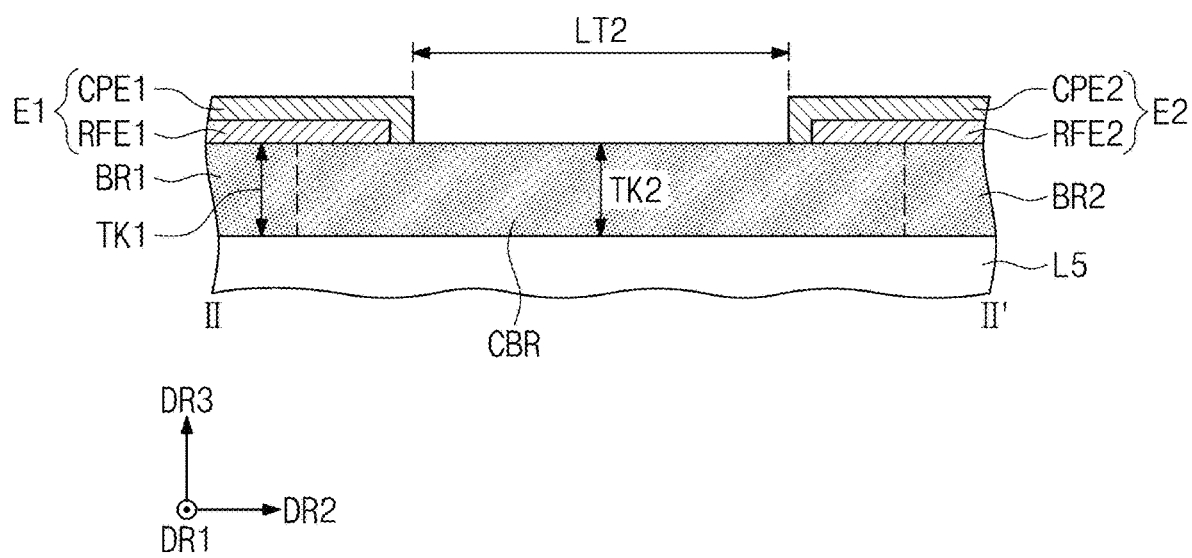
FIG. 7B is a cross-sectional view taken along line II-II' of FIG. 6.

FIG. 7A is a cross-sectional view taken along line I-I' of FIG. 6, and FIG. 7B is a cross-sectional view taken along line II-II' of FIG. 6.

FIG. 7A may be a cross-sectional view of an area adjacent to the connection partition portion CBR. In other words, FIG. 7A may be a cross-sectional view of an area in which the connection partition portions CBR are not disposed in a plan view, for example, an area which does not overlap with the connection partition portions CBR in a plan view. FIG. 7B may be a cross-sectional view of an area overlapping with the connection partition portion CBR. In other words, FIG. 7B may be a cross-sectional view of an area in which the connection partition portion CBR is disposed in a plan view.

A first distance LT1 between the first electrode E1 and the second electrode E2 is illustrated in FIG. 7A, and a second distance LT2 between the first electrode E1 and the second electrode E2 is illustrated in FIG. 7B. Each of the first and second distances LT1 and LT2 may be a distance measured between the first electrode E1 and the second electrode E2 when viewed in a plan view (e.g., when viewed in the third direction DR3). In one embodiment, for example, each of the first and second distances LT1 and LT2 may be a distance in the second direction DR2. In an embodiment, the first distance LT1 and the second distance LT2 may be equal to each other.

Each of the first and second partition portions BR1 and BR2 may have a first thickness TK1, and each of the connection partition portions CBR may have a second thickness TK2. The first thickness TK1 may be a maximum thickness of each of the first and second partition portions BR1 and BR2, and the second thickness TK2 may be a maximum thickness of each of the connection partition portions CBR. In an embodiment, the first thickness TK1 and the second thickness TK2 may be equal to each other.

A space SPA surrounded by the first and second partition portions BR1 and BR2 and first and second connection partition portions CBR1 and CBR2, adjacent to each other, of the plurality of connection partition portions CBR may be defined. The light emitting element ED may be disposed in the space SPA when viewed in a plan view. According to an embodiment of the invention, an arrangement position of the light emitting element ED may be determined by the space SPA.

Figure 8:
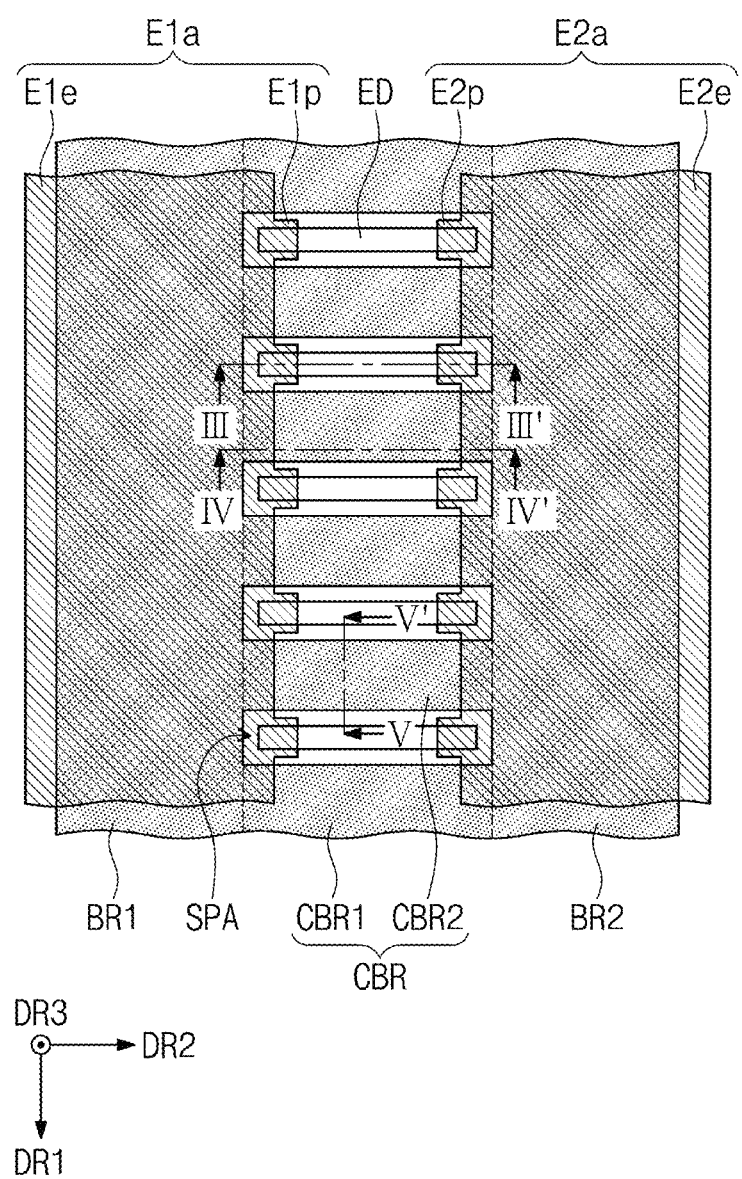
FIG. 8 is a plan view illustrating some components of a display panel according to an alternative embodiment of the invention.
Figure 9A:
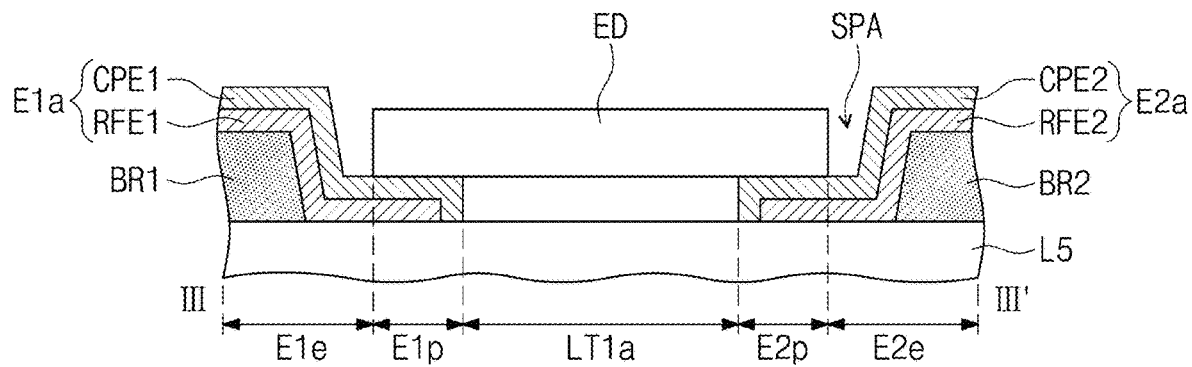
FIG. 9A is a cross-sectional view taken along line III-III' of FIG. 8.
Figure 9A:
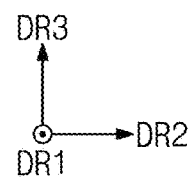
Figure 9B:
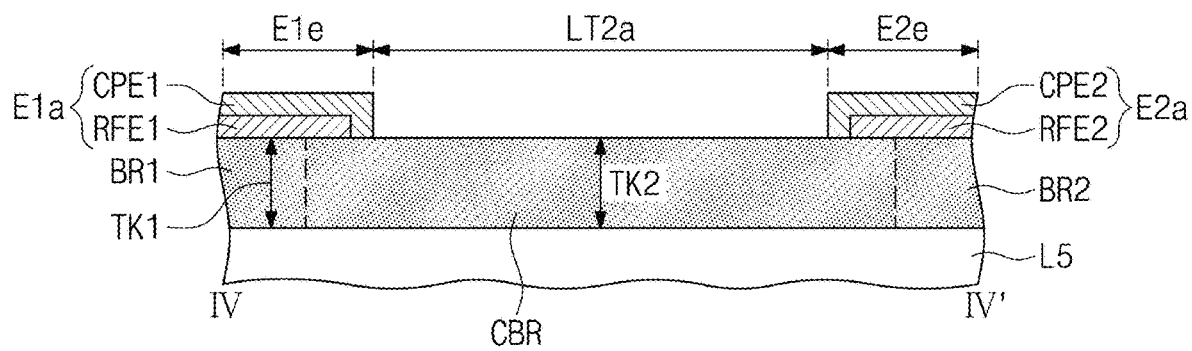
FIG. 9B is a cross-sectional view taken along line IV-IV' of FIG. 8.
Figure 9B:
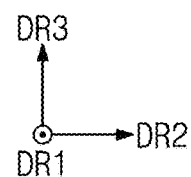

FIG. 8 is a plan view illustrating some components of a display panel according to an alternative embodiment of the invention. FIG. 9A is a cross-sectional view taken along line III-III' of FIG. 8. FIG. 9B is a cross-sectional view taken along line IV-IV' of FIG. 8.

Referring to FIGS. 8, 9A and 9B, in an embodiment of a display panel, a first electrode E1a may include a first extension electrode portion E1e extending in the first direction DR1 and a first protrusion electrode portion E1p protruding from the first extension electrode portion E1e. A second electrode E2a may include a second extension electrode portion E2e extending in the first direction DR1 and a second protrusion electrode portion E2p protruding from the second extension electrode portion E2e. The first protrusion electrode portion E1p may protrude from the first extension electrode portion E1e in a direction toward the second electrode E2a, and the second protrusion electrode portion E2p may protrude from the second extension electrode portion E2e in a direction toward the first electrode E1a.

In an embodiment, the first protrusion electrode portion E1p and the second protrusion electrode portion E2p may be disposed between the connection partition portions CBR adjacent to each other when viewed in a plan view. In such an embodiment, the first protrusion electrode portion E1p and the second protrusion electrode portion E2p may overlap the space SPA surrounded by the first and second connection partition portions CBR1 and CBR2 and the first and second partition portions BR1 and BR2 when viewed in a plan view.

A first distance LT1a between the first electrode E1a and the second electrode E2a is illustrated in FIG. 9A, and a second distance LT2a between the first electrode E1a and the second electrode E2a is illustrated in FIG. 9B. Each of the first and second distances LT1a and LT2a may be a distance measured between the first electrode E1a and the second electrode E2a when viewed in a plan view (e.g., when viewed in the third direction DR3). In one embodiment, for example, each of the first and second distances LT1a and LT2a may be a distance in the second direction DR2.

The first distance LT1a may correspond to a minimum distance between the first protrusion electrode portion E1p and the second protrusion electrode portion E2p, and the second distance LT2a may correspond to a minimum distance between the first extension electrode portion E1e and the second extension electrode portion E2e. In an embodiment, the first distance LT1a may be less than the second distance LT2a.

According to an embodiment of the invention, as described above, the first distance LT1a between the first and second electrodes E1a and E2a in an area in which the light emitting element ED is disposed may be less than the second distance LT2a between the first and second electrodes E1a and E2a in an area in which the light emitting element ED is not disposed.

Figure 10:
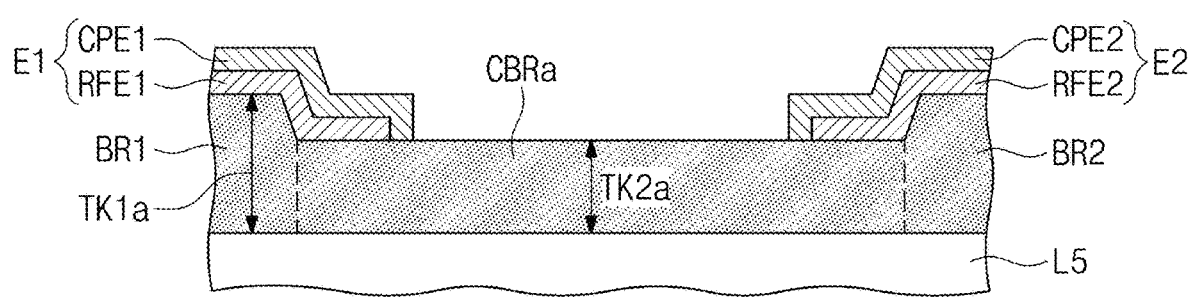
FIG. 10 is a cross-sectional view illustrating an alternative embodiment of the portion shown in FIG. 7B.
Figure 10:
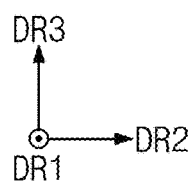

FIG. 10 is a cross-sectional view illustrating an alternative of the portion shown in FIG. 7B.

Referring to FIG. 10, each of the first and second partition portions BR1 and BR2 may have a first thickness TK1a, and each of connection partition portions CBRa may have a second thickness TK2a. The first thickness TK1a may be a maximum thickness of each of the first and second partition portions BR1 and BR2, and the second thickness TK2a may be a maximum thickness of each of the connection partition portions CBRa. In an embodiment, the first thickness TK1a may be greater than the second thickness TK2a.

Figure 11A:
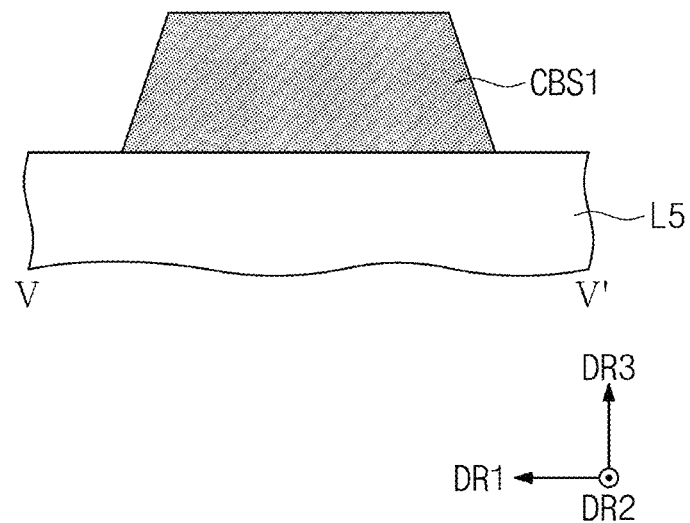
FIG. 11A is a cross-sectional view taken along line V-V' of FIG. 8.

FIG. 11A is a cross-sectional view taken along line V-V' of FIG. 8. Referring to FIGS. 8 and 11A, a cross section CBS1 of each of the connection partition portions CBR may have a trapezoidal shape. The cross section CBS1 may be a plane parallel to the first direction DR1 and the third direction DR3.

Figure 11B:
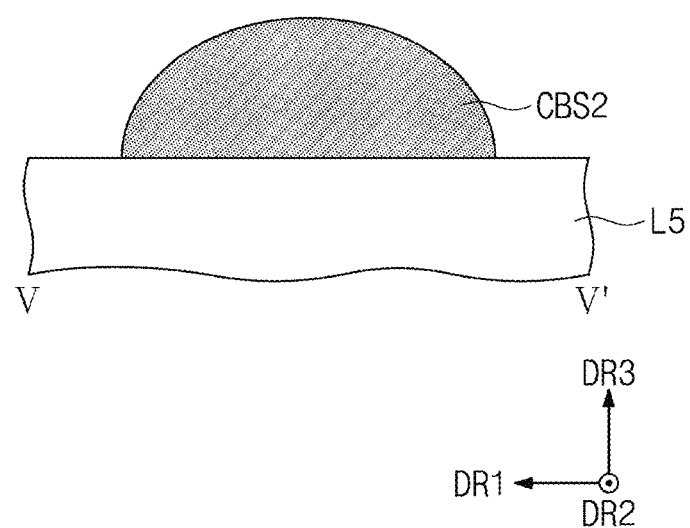
FIG. 11B is a cross-sectional view illustrating an alternative embodiment of the portion shown in FIG. 11A.

FIG. 11B is a cross-sectional view illustrating an alternative embodiment of the portion shown in FIG. 11A.

Referring to FIGS. 8 and 11B, an outermost surface of each of the connection partition portions CBR may have a curvature when viewed in a cross-sectional view parallel to the first direction DR1 and the third direction DR3. In one embodiment, for example, a cross section CBS2 of each of the connection partition portions CBR may have a convex lens shape. In such an embodiment, where the connection partition portions CBR have round shapes, the light emitting element ED disposed on the connection partition portions CBR may be effectively guided into the space between the connection partition portions CBR in a process of aligning the light emitting element ED.

FIGS. 12A to 12D are schematic views illustrating an embodiment of a process of forming a first partition portion, a second partition portion, and a plurality of connection partition portions.

Referring to FIG. 12A, the first base layer BL1 may be prepared. Even though not shown in the drawings, the first base layer BL1 may be disposed on a work substrate (not shown) in manufacturing processes. After a display panel is manufactured, the work substrate may be removed.

The pixel circuit PXC (see FIG. 3) including the first and second thin film transistors TR1 and TR2 may be provided or formed on the first base layer BL1. The fifth insulating layer L5 may be provided or formed to cover the pixel circuit PXC. The fifth insulating layer L5 may include an organic material. The fifth insulating layer L5 may provide a flat top surface.

A preliminary insulating layer BBR may be provided or formed on the fifth insulating layer L5. The preliminary insulating layer BBR may include an organic material.

Figure 12B:
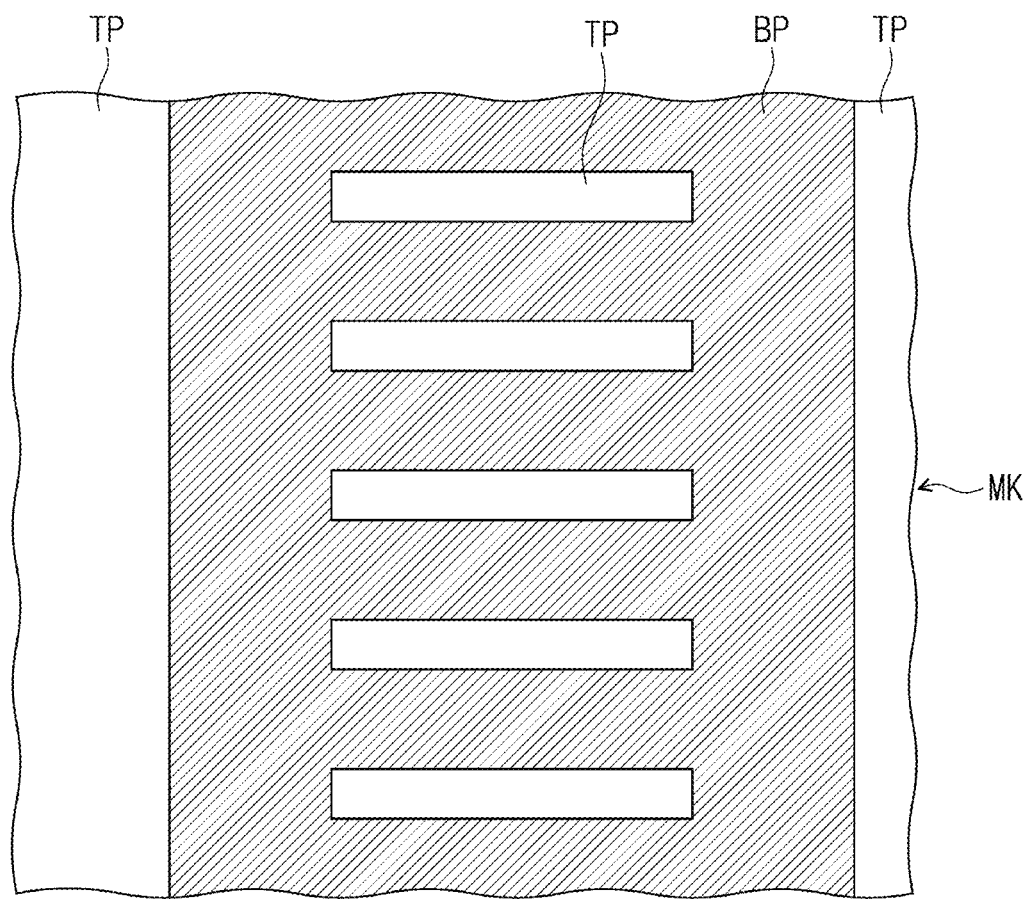

Referring to FIGS. 12A and 12B, after the formation of the preliminary insulating layer BBR, a mask MK may be disposed over the preliminary insulating layer BBR. The mask MK may be a binary mask including a light transmitting portion TP and a light blocking portion BP.

The preliminary insulating layer BBR may be a positive photoresist layer or a negative photoresist layer. Hereinafter, for convenience of description, an embodiment where the preliminary insulating layer BBR is the positive photoresist layer will be described in detail.

In such an embodiment, the light blocking portion BP may be disposed to overlap an area in which first and second partition portions BR1 and BR2 (see FIGS. 12C and 12D) and connection partition portions CBR (see FIG. 12D) are to be formed. The light transmitting portion TP may overlap a remaining area except the area. Light may be irradiated after the mask MK is disposed over the preliminary insulating layer BBR.

Figure 12C:
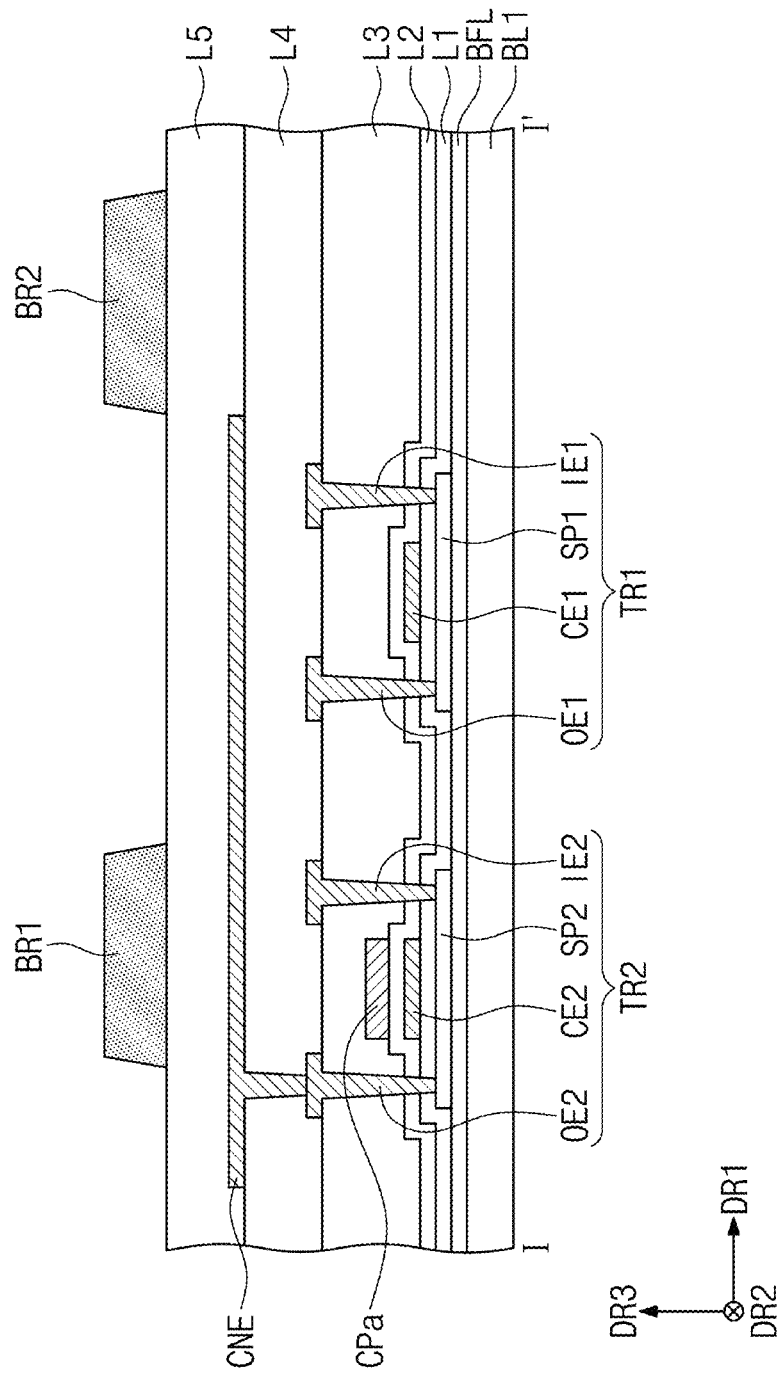
Figure 12D:
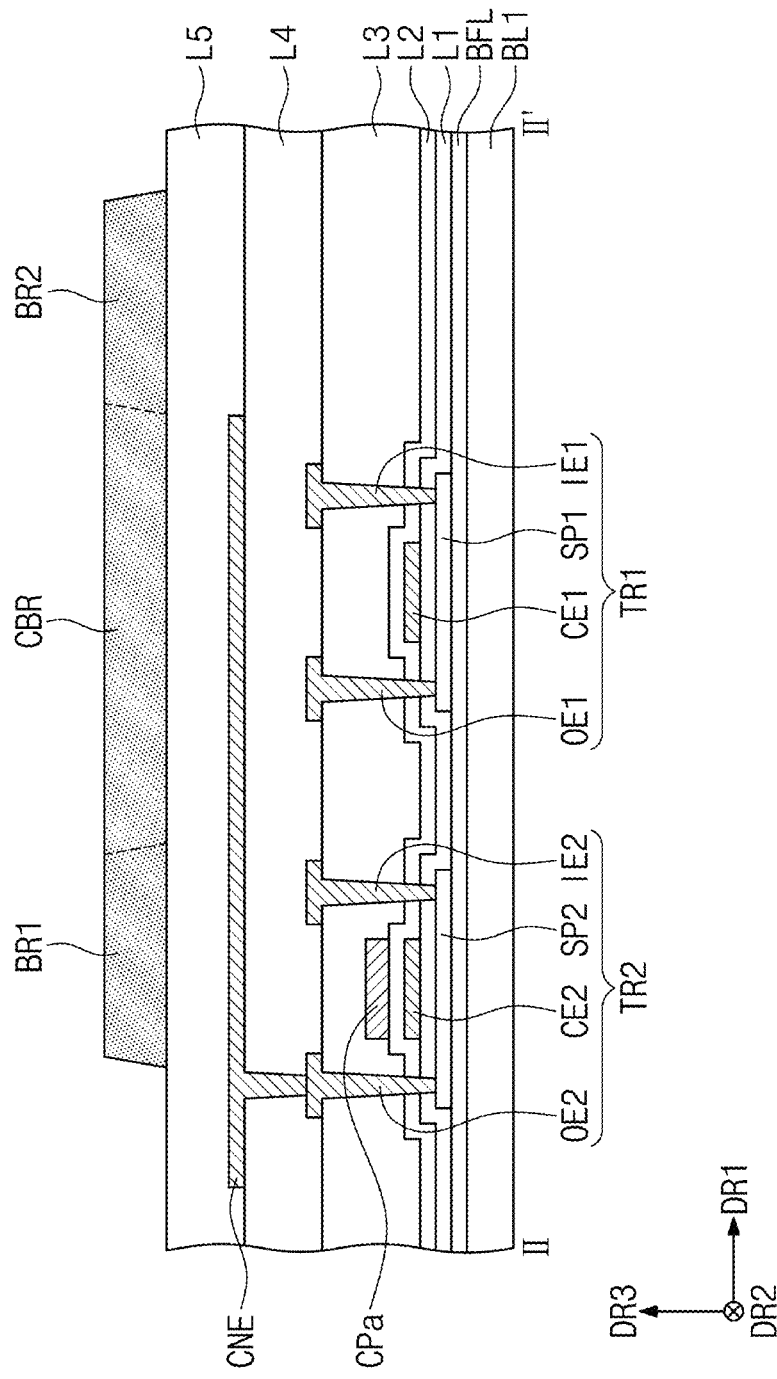

Referring to FIGS. 12C and 12D, the preliminary insulating layer BBR (see FIG. 12A) may be patterned to form the first partition portion BR1, the second partition portion BR2, and the connection partition portions CBR. The patterning process may include an exposure process and a development process. The first partition portion BR1, the second partition portion BR2 and the connection partition portions CBR may be formed at the same time by a same process.

Figure 13A:
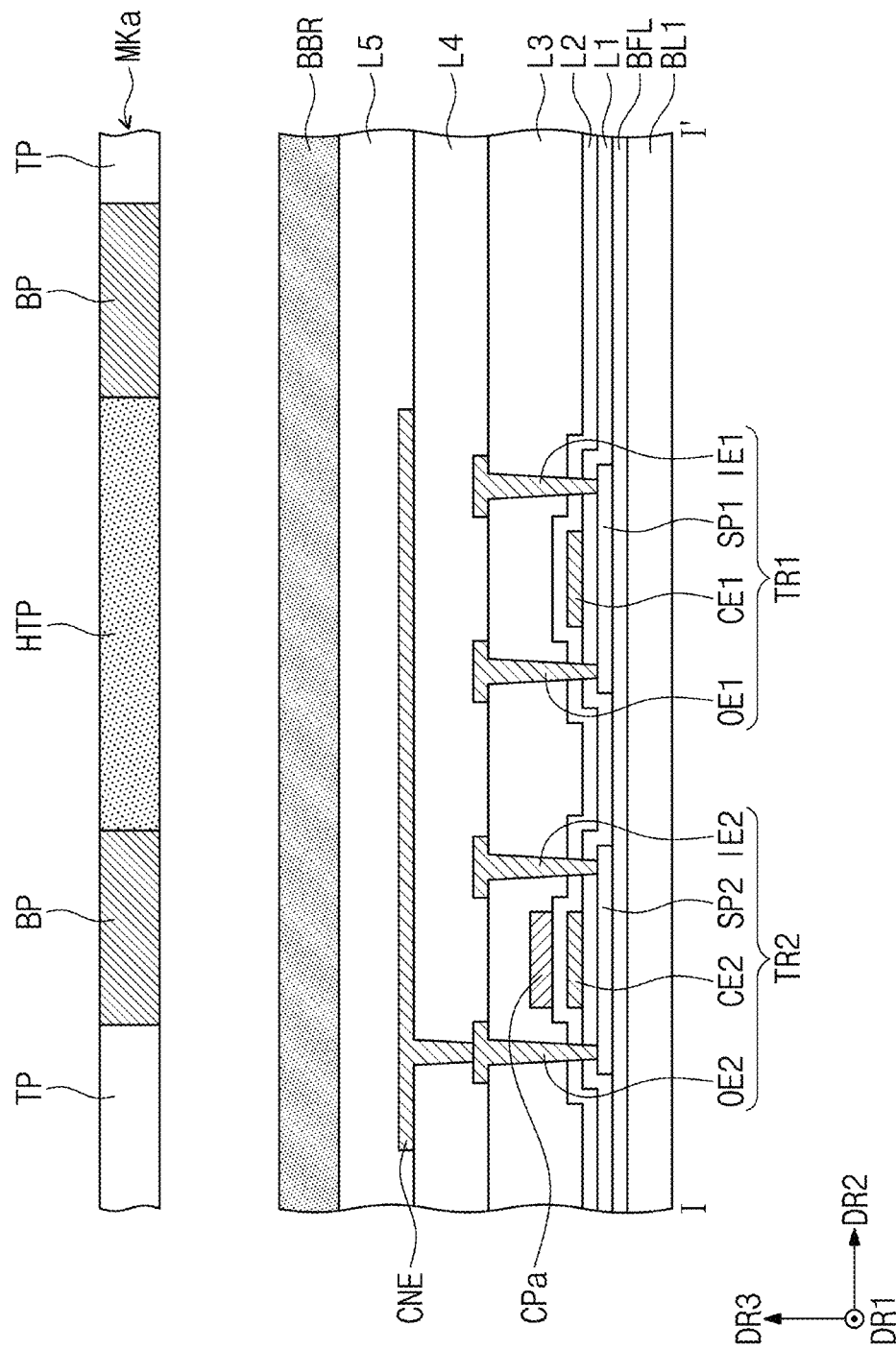
FIGS. 13A, 13B and 13C are schematic views illustrating an alternative embodiment of a process of forming a first partition portion, a second partition portion, and a plurality of connection partition portions.
Figure 13B:
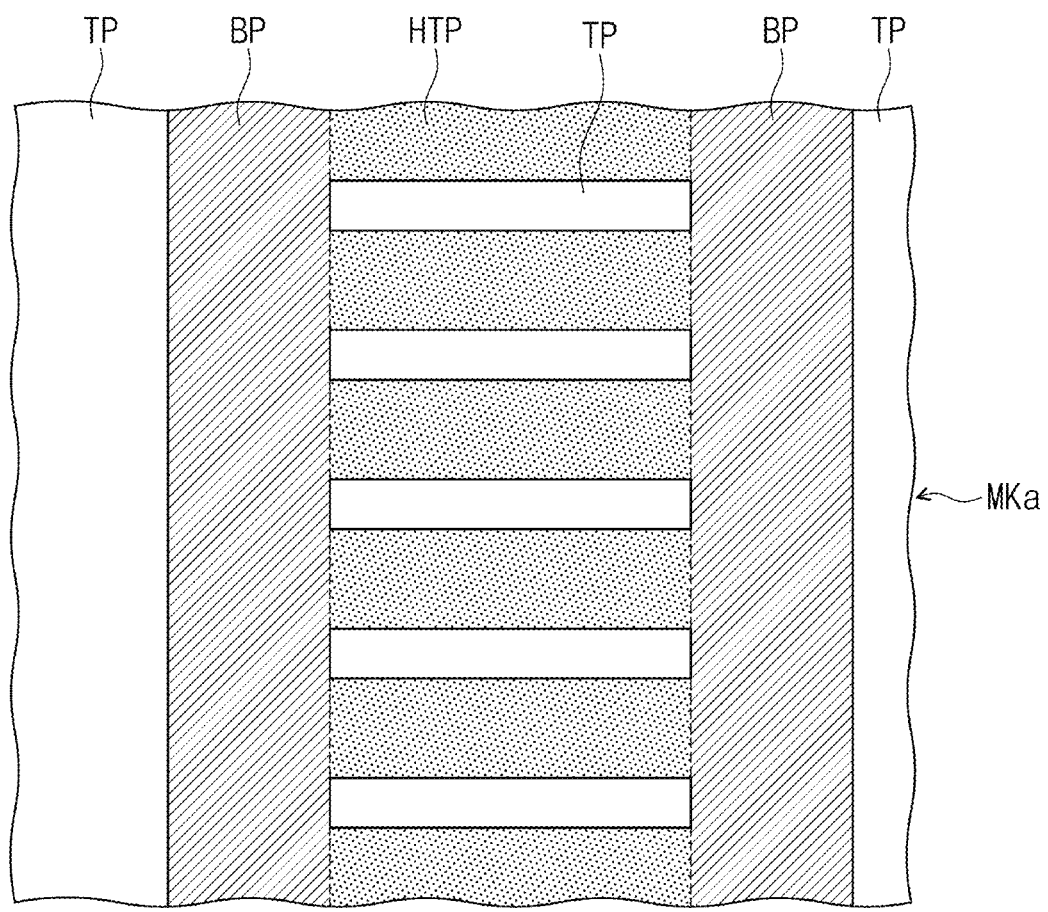
Figure 13C:
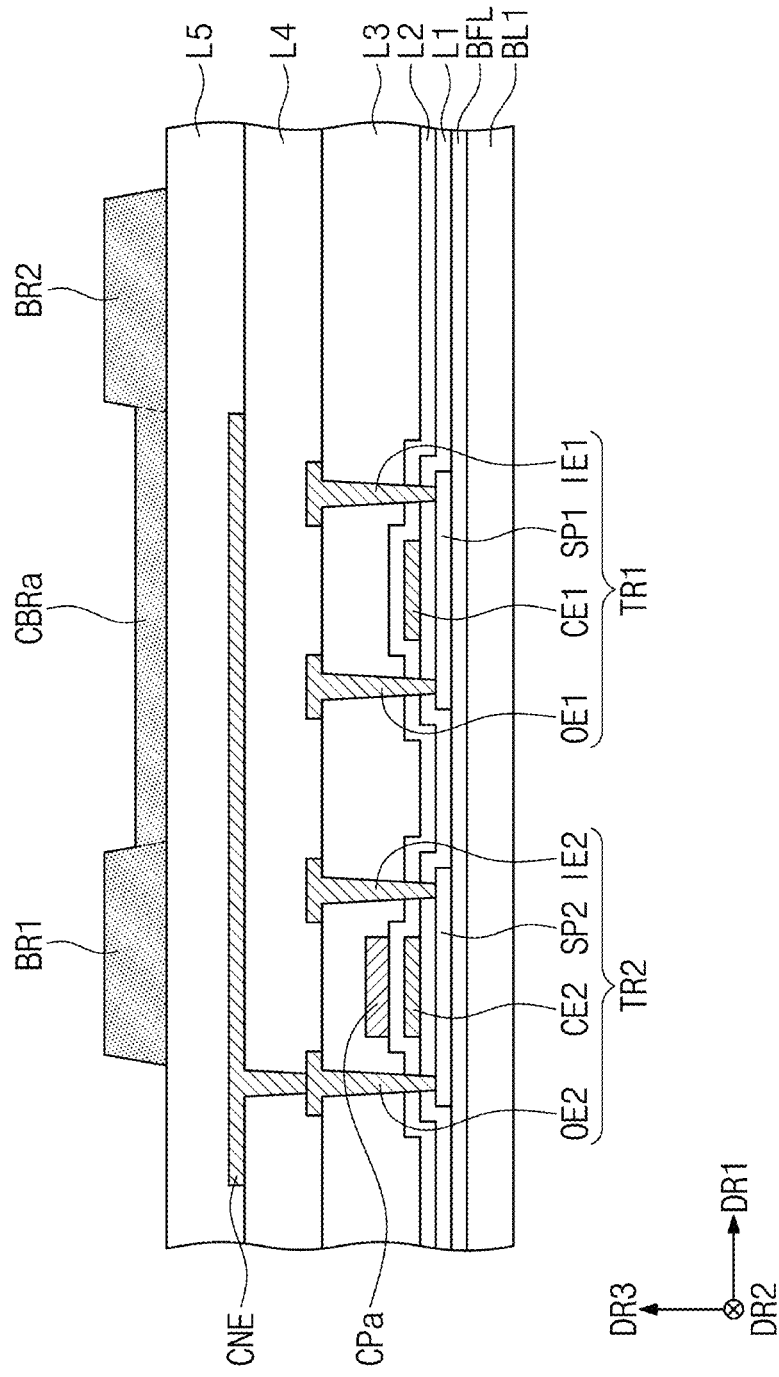

FIGS. 13A to 13C are schematic views illustrating an alternative embodiment of a process of forming a first partition portion, a second partition portion, and a plurality of connection partition portions.

Referring to FIGS. 13A to 13C, after the formation of the preliminary insulating layer BBR, a mask MKa may be disposed over the preliminary insulating layer BBR. The mask MKa may be a halftone mask including a light transmitting portion TP, a light semi-transmitting portion HTP, and a light blocking portion BP.

The light blocking portion BP may be disposed to overlap a first area in which the first and second partition portions BR1 and BR2 are to be formed, and the light semi-transmitting portion HTP may be disposed to overlap a second area in which the connection partition portions CBRa are to be formed. The light transmitting portion TP may overlap a remaining area except the first area and the second area.

The preliminary insulating layer BBR may be patterned to form the first partition portion BR1, the second partition portion BR2, and the connection partition portions CBRa. Portions of the connection partition portions CBRa in a thickness direction may be removed, and thus thicknesses of the connection partition portions CBRa may be less than thicknesses of the first and second partition portions BR1 and BR2. As a result, the probability of disposing the light emitting element ED (see FIG. 5) between the first and second partition portions BR1 and BR2 may be increased in a process of providing the light emitting element ED.

Figure 14:
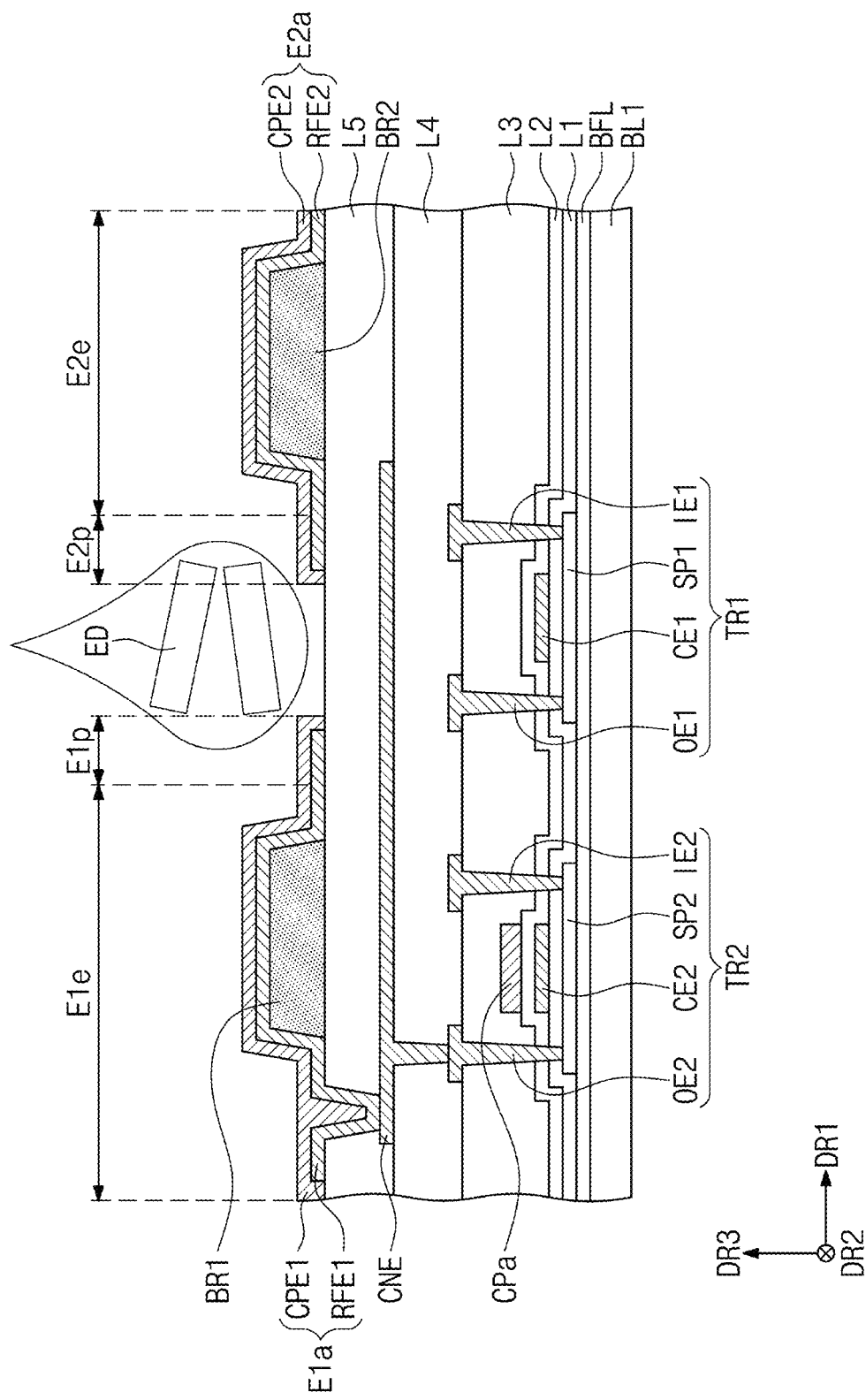
FIG. 14 is a cross-sectional view illustrating a process of aligning a light emitting element according to an embodiment of the invention.

FIG. 14 is a cross-sectional view illustrating a process of aligning a light emitting element according to an embodiment of the invention.

Referring to FIGS. 8 and 14, the first electrode E1a covering the first partition portion BR1 and the second electrode E2a covering the second partition portion BR2 may be formed.

A solution including the light emitting element ED and solvent may be provided onto the first electrode E1a and the second electrode E2a. The solvent may be a material which can be evaporated at room temperature or by heat. The solution may be ink or paste which may include the light emitting element ED. The light emitting element ED may be disposed in the space defined among the first partition portion BR1, second partition portion BR2, and connection partition portions CBR. According to an embodiment of the invention, an arrangement position of the light emitting element ED may be controlled by the connection partition portions CBR.

Electric power may be applied to the first and second electrodes E1a and E2a to form an electric field between the first and second electrodes E1a and E2a. Bipolarity may be induced in the light emitting element ED by the electric field, and the light emitting element ED may be aligned on the first electrode E1a and the second electrode E2a by dielectrophoretic force. According to embodiments of the invention, the distance between the first and second electrodes E1a and E2a in the area in which the light emitting element ED is disposed may be less than the distance between the first and second electrodes E1a and E2a in the area in which the light emitting element ED is not disposed. As a result, the dielectrophoretic force occurring at the light emitting element ED may be increased, and thus the light emitting element ED may be effectively aligned.

According to embodiments of the invention, the arrangement position of the light emitting element ED may be controlled by the connection partition portions CBR, and the light emitting element ED may be effectively aligned by the first and second protrusion electrode portions E1p and E2p. Thus, an effective alignment probability of the light emitting element ED may be increased. As a result, a yield of products and reliability of the products may be improved.

According to embodiments of the invention, the display device may include the plurality of connection partition portions connecting the first partition portion and the second partition portion, and the light emitting element may be disposed in the space defined by the plurality of connection partition portions, the first partition portion and the second partition portion. In addition, the first electrode may include the first extension electrode portion and the first protrusion electrode portion, and the second electrode may include the second extension electrode portion and the second protrusion electrode portion. The first and second protrusion electrode portions may be disposed in the space between the plurality of connection partition portions. The arrangement direction and the arrangement position of the light emitting element may be controlled by the plurality of connection partition portions and the first and second protrusion electrode portions. Thus, the manufacturing yield and reliability of the display device may be improved.

While the invention have been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:
1. A display device comprising:
   a pixel circuit;
   an insulating layer covering the pixel circuit;
   a first partition portion which is disposed on the insulating layer and extends in a first direction;
   a second partition portion which is spaced apart from the first partition portion in a second direction intersecting the first direction and extends in the first direction;
   a plurality of connection partition portions, each connection partition portion spaced apart from each other, disposed between the first and second partition portions, and extending in the second direction;
a first electrode disposed on the first partition portion and electrically connected to the pixel circuit;
a second electrode disposed on the second partition portion; and
a light emitting element having a first side electrically connected to the first electrode, a second side opposite the first side and electrically connected to the second electrode, a third side that connects the first side and the second side as seen from plan view, and a fourth side opposite the third side and that connect the first side and the second side as seen from plan view, wherein
the light emitting element is disposed such that the third side faces a first connection partition portion of the plurality of connection partition portions,
the fourth side faces a second connection partition portion of the plurality of connection partition portions, and
an arrangement position of the light emitting element is controlled by the first and second connection partition portions.

2. The display device of claim 1, wherein the light emitting element is completely surrounded by the first partition portion, the second partition portion, and the plurality of connection partition portions when viewed in a plan view.

3. The display device of claim 2, wherein the first partition portion, the second partition portion, and the plurality of connection partition portions include a same material as each other.

4. The display device of claim 2, wherein
the first electrode extends in the first direction and covers the first partition portion,
the second electrode extends in the first direction and covers the second partition portion, and
a first distance in the second direction between the first and second electrodes in an area adjacent to the plurality of connection partition portions is equal to a second distance in the second direction between the first and second electrodes in an area overlapping with the plurality of connection partition portions when viewed in the plan view.

5. The display device of claim 2, wherein
the first electrode comprises:
a first extension electrode portion extending in the first direction; and
a first protrusion electrode portion protruding from the first extension electrode portion in a direction toward the second electrode, and
the second electrode comprises:
a second extension electrode portion extending in the first direction; and
a second protrusion electrode portion protruding from the second extension electrode portion in a direction toward the first electrode.

6. The display device of claim 5, wherein
the first protrusion electrode portion is disposed between the plurality of connection partition portions when viewed in the plan view, and
the second protrusion electrode portion is disposed between the plurality of connection partition portions when viewed in the plan view.

7. The display device of claim 5, wherein
a first distance in the second direction between the first protrusion electrode portion and the second protrusion electrode portion is less than a second distance in the second direction between the first extension electrode portion and the second extension electrode portion when viewed in the plan view.

8. The display device of claim 1, wherein
each of the first and second partition portions has a first thickness,
each of the plurality of connection partition portions has a second thickness, and
the first thickness is equal to the second thickness.

9. The display device of claim 1, wherein
each of the first and second partition portions has a first thickness,
each of the plurality of connection partition portions has a second thickness, and
the first thickness is greater than the second thickness.

10. The display device of claim 1, wherein each of the plurality of connection partition portions has a trapezoidal shape when viewed in a cross-sectional view parallel to the first direction.

11. The display device of claim 1, wherein an outermost surface of each of the plurality of connection partition portions has a curvature when viewed in a cross-sectional view parallel to the first direction.

12. The display device of claim 1, wherein
the plurality of connection partition portions are spaced apart from each other in the first direction, and
the first partition portion, the second partition portion and the plurality of connection partition portions are connected to each other to constitute a single unitary body.

13. A method of manufacturing a display device, the method comprising:
providing a pixel circuit on a base layer;
providing an insulating layer covering the pixel circuit;
providing a preliminary insulating layer on the insulating layer;
patterning the preliminary insulating layer to form a first partition portion, a second partition portion, and a plurality of connection partition portions spaced apart from each other;
providing a first electrode covering the first partition portion;
providing a second electrode covering the second partition portion;
providing a light emitting element between the first electrode and the second electrode and between the plurality of connection partition portions such that the light emitting element has a first side electrically connected to the first electrode, a second side opposite the first side and electrically connected to the second electrode, a third side that connects the first side and the second side as seen from plan view, and a fourth side opposite the third side that connect the first side and the second side as seen from plan view; and
aligning the light emitting element such that the third side faces a first connection partition portion of the plurality of connection partition portions as seen from plan view, and the fourth side faces a second connection partition portion of the plurality of connection partition portions as seen from plan view, wherein an arrangement position of the light emitting element is controlled by the first and second connection partition portions.

14. The method of claim 13, wherein the patterning the preliminary insulating layer comprises:
disposing a mask over the preliminary insulating layer; and exposing and developing the preliminary insulating layer using the mask to form the first partition portion, the second partition portion, and the plurality of connection partition portions.

15. The method of claim 14, wherein
the mask includes a light blocking portion and a light transmitting portion, and
the disposing the mask over the preliminary insulating layer comprises
    disposing the mask in a way such that the light blocking portion is disposed to overlap an area in which the first and second partition portions and the plurality of connection partition portions are to be formed.

16. The method of claim 14, wherein
the mask includes a light blocking portion, a light transmitting portion, and a light semi-transmitting portion, and
the disposing the mask over the preliminary insulating layer comprises disposing the mask in a way such that the light blocking portion is disposed to overlap an area in which the first and second partition portions are to be formed, and
the light semi-transmitting portion is disposed to overlap an area in which the plurality of connection partition portions are to be formed.

17. A display device comprising:
a first partition portion extending in a first direction;
a second partition portion which is spaced apart from the first partition portion in a second direction intersecting the first direction and extends in the first direction;
a first electrode disposed on the first partition portion;
a second electrode disposed on the second partition portion;
a first connection partition portion disposed between the first partition portion and the second partition portion;
a second connection partition portion disposed between the first partition portion and the second partition portion and spaced apart from the first connection partition portion in the first direction; and
a light emitting element disposed in a space defined by the first and second partition portions and the first and second connection partition portions such that the light emitting element has a first side electrically connected to the first electrode, a second side opposite the first side and electrically connected to the second electrode, a third side that connects the first side and the second side as seen from plan view and faces the first connection partition portion, and a fourth side opposite the third side that connect the first side and the second side as seen from plan view and faces the second connection partition portion, wherein an arrangement position of the light emitting element is controlled by the first and second connection partition portions.

18. The display device of claim 17, wherein
the first and second electrodes extend in the first direction and are spaced apart from each other in the second direction, and
a separation distance between the first and second electrodes in the second direction is different depending on a position.

19. The display device of claim 18, wherein
the separation distance in an area overlapping the first connection partition portion or the second connection partition portion is greater than the separation distance in an area between the first connection partition portion and the second connection partition portion when viewed in a plan view.

20. The display device of claim 18, wherein
the first electrode comprises:
    a first extension electrode portion extending in the first direction; and
    a first protrusion electrode portion protruding from the first extension electrode portion in a direction toward the second electrode, and
the second electrode comprises:
    a second extension electrode portion extending in the first direction; and a second protrusion electrode portion protruding from the second extension electrode portion in a direction toward the first electrode, wherein
    the first protrusion electrode portion and the second protrusion electrode portion are disposed in an area between the first connection partition portion and the second connection partition portion.

21. The display device of claim 5, wherein an arrangement position of the light emitting element is controlled by the first and second connection partition portions and the first and second protrusion electrode portions.

* * * * *